United States Patent
Kim et al.

(10) Patent No.: US 11,935,471 B2
(45) Date of Patent: *Mar. 19, 2024

(54) ORGANIC LIGHT EMITTING DISPLAY DEVICE

(71) Applicant: SAMSUNG DISPLAY CO., LTD., Yongin-si (KR)

(72) Inventors: Yong Jae Kim, Yongin-si (KR); Jin Jeon, Yongin-si (KR); Chul Kyu Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,838

(22) Filed: Mar. 7, 2022

(65) Prior Publication Data

US 2022/0199023 A1     Jun. 23, 2022

Related U.S. Application Data

(63) Continuation of application No. 17/099,677, filed on Nov. 16, 2020, now Pat. No. 11,270,640, which is a
(Continued)

(30) Foreign Application Priority Data

Apr. 11, 2017   (KR) .................. 10-2017-0046813

(51) Int. Cl.
*G09G 3/3208*    (2016.01)
*G09G 3/3233*    (2016.01)
(Continued)

(52) U.S. Cl.
CPC ......... *G09G 3/3233* (2013.01); *G09G 3/3266* (2013.01); *H10K 50/805* (2023.02);
(Continued)

(58) Field of Classification Search
CPC ............... G09G 3/3233; G09G 3/3266; G09G 2300/0842; G09G 2300/0861;
(Continued)

(56) References Cited

U.S. PATENT DOCUMENTS 7,414,599 B2    8/2008   Chung et al.
7,999,770 B2    8/2011   Kasai
(Continued)

FOREIGN PATENT DOCUMENTS

CN    102243840 A    11/2011
CN    102376248 A    3/2012
(Continued)

*Primary Examiner* — Matthew A Eason
*Assistant Examiner* — Chayce R Bibbee
(74) *Attorney, Agent, or Firm* — Lewis Roca Rothgerber Christie LLP

(57) ABSTRACT

An organic light emitting display device driven at a first driving frequency or a second driving frequency lower than the first driving frequency includes pixels coupled to first scan lines, second scan lines, and data lines, a first scan driver configured to supply scan signals to the first scan lines during a first period and a second period in one frame period, when the organic light emitting display device is driven at the second driving frequency, a second scan driver configured to supply scan signals to the second scan lines during the first period, when the organic light emitting display device is driven at the second driving frequency, and a data driver configured to supply a data signal to the data lines during the first period.

16 Claims, 27 Drawing Sheets

Related U.S. Application Data continuation of application No. 15/839,455, filed on Dec. 12, 2017, now Pat. No. 10,909,918.

(51) Int. Cl.
*G09G 3/3266* (2016.01)
*H10K 50/805* (2023.01)
*H10K 59/131* (2023.01)

(52) U.S. Cl.
CPC ... *H10K 59/131* (2023.02); *G09G 2300/0842* (2013.01); *G09G 2300/0861* (2013.01); *G09G 2310/0251* (2013.01); *G09G 2310/0262* (2013.01); *G09G 2310/0264* (2013.01); *G09G 2340/0435* (2013.01)

(58) Field of Classification Search
CPC ... G09G 2310/0251; G09G 2310/0262; G09G 2310/0264; G09G 2340/0435; H01L 27/3276; H01L 51/5203; H10K 50/805; H10K 59/131
See application file for complete search history.

(56) References Cited

U.S. PATENT DOCUMENTS

| | | | |
|---|---|---|---|
| 8,384,706 B2 | 2/2013 | Seo et al. | |
| 9,148,930 B2 | 9/2015 | Chung et al. | |
| 9,330,601 B2 | 5/2016 | Lee et al. | |
| 9,449,548 B2 | 9/2016 | Shin | |
| 10,109,240 B2 | 10/2018 | Chang et al. | |
| 11,270,640 B2 * | 3/2022 | Kim | G09G 3/3266 |
| 2004/0130513 A1 | 7/2004 | Miyazawa | |
| 2011/0057917 A1 | 3/2011 | Ryu et al. | |
| 2014/0184484 A1 | 7/2014 | Miyake et al. | |
| 2015/0356899 A1 | 12/2015 | Yamanaka et al. | |
| 2016/0019856 A1 | 1/2016 | Tanaka et al. | |

FOREIGN PATENT DOCUMENTS

| | | |
|---|---|---|
| CN | 103871356 A | 6/2014 |
| EP | 0 875 881 A2 | 11/1998 |
| EP | 1 501 067 A1 | 1/2005 |
| KR | 10-0560780 B1 | 3/2006 |
| KR | 10-2015-0076868 A | 7/2015 |

* cited by examiner

ORGANIC LIGHT EMITTING DISPLAY DEVICE

CROSS-REFERENCE TO RELATED APPLICATIONS

This application is a continuation of U.S. patent application Ser. No. 17/099,677, filed Nov. 16, 2020, which is a continuation of U.S. patent application Ser. No. 15/839,455, filed Dec. 12, 2017, now U.S. Pat. No. 10,909,918, which claims priority to and the benefit of Korean Patent Application No. 10-2017-0046813, filed Apr. 11, 2017, the entire content of all of which is incorporated herein by reference.

BACKGROUND

1. Field

An aspect of the present disclosure relates to an organic light emitting display device, and more particularly, to an organic light emitting display device capable of improving display quality.

2. Description of the Related Art

With the development of information technologies, the importance of a display device, which is a connection medium between a user and information, increases. Accordingly, display devices such as a liquid crystal display device and an organic light emitting display device are increasingly used.

Among these display devices, the organic light emitting display device displays images using organic light emitting diodes that generate light by recombination of electrons and holes. The organic light emitting display device has a high response speed and has low power consumption.

Recently, a method for driving an organic light emitting display device at a low frequency has been used so as to reduce or minimize power consumption. What is desired is a method capable of improving display quality when an organic light emitting display device is driven at a low frequency.

SUMMARY

Aspects of embodiments of the present disclosure are directed to an organic light emitting display device capable of improving display quality.

According to an embodiment of the present disclosure, there is provided an organic light emitting display device configured to be driven at a first driving frequency or a second driving frequency that is lower than the first driving frequency, the organic light emitting display device including: pixels coupled to first scan lines, second scan lines, and data lines; a first scan driver configured to supply scan signals to the first scan lines during a first period and a second period in one frame period, when the organic light emitting display device is driven at the second driving frequency; a second scan driver configured to supply scan signals to the second scan lines during the first period, when the organic light emitting display device is driven at the second driving frequency; and a data driver configured to supply a data signal to the data lines during the first period.

In an embodiment, when the organic light emitting display device is driven at the first driving frequency, the first scan driver is configured to supply scan signals to the first scan lines during the one frame period, and the second scan driver is configured to supply scan signals to the second scan lines during the one frame period.

In an embodiment, when the organic light emitting display device is driven at the first driving frequency, a scan signal supplied to an ith (i being a natural number) first scan line overlaps with that supplied to an ith second scan line.

In an embodiment, the data driver is configured to supply the data signal to be synchronized with the scan signals supplied to the first scan lines.

In an embodiment, when the organic light emitting display device is driven at the second driving frequency, the first scan driver is configured to supply j (j being a natural number of 2 or more) scan signals to each of the first scan lines during the one frame period, and the second scan driver is configured to supply k (k being a natural number smaller than j) scan signals to each of the second scan lines during the one frame period.

In an embodiment, during the first period, a scan signal supplied to an ith (i being a natural number) first scan line overlaps with that supplied to an ith second scan line.

In an embodiment, the second period is longer than the first period.

In an embodiment, the first scan driver is configured to supply a scan signal to each of the first scan lines at least twice or more during the second period.

In an embodiment, the data driver is configured to supply a voltage of a reference power source to the data lines during the second period.

In an embodiment, the reference power source is set to a voltage within a voltage range of data signals supplied from the data driver.

In an embodiment, the organic light emitting display device further includes: emission control lines in parallel to the first scan lines, the emission control lines being coupled to the pixels; and an emission driver configured to supply emission control signals to the emission control lines during a period in which the organic light emitting display device is driven at the first driving frequency, the first period, and the second period.

In an embodiment, an emission control signal supplied to an ith (i being a natural number) emission control line overlaps with a scan signal supplied to an ith first scan line during at least a partial period.

In an embodiment, each of pixels at an ith (i being a natural number) horizontal line includes: an organic light emitting diode; and a pixel circuit configured to control an amount of current flowing from a first driving power source to a second driving power source via the organic light emitting diode.

In an embodiment, the reference power source is set to a voltage different from that of the first driving power source.

In an embodiment, the pixel circuit includes: a first transistor coupled to the first driving power source via a first node coupled to a first electrode thereof, the first transistor being configured to control the amount of current supplied to the organic light emitting diode, the amount of current corresponding to a voltage of a second node; a second transistor coupled between a data line and the first node, the second transistor being configured to turn on when a scan signal is supplied to an ith first scan line; a third transistor coupled between a second electrode of the first transistor and the second node, the third transistor being configured to turn on when a scan signal is supplied to an ith second scan line; a fourth transistor coupled between the second node and an initialization power source, the fourth transistor being configured to turn on when a scan signal is supplied to an (i−1)th second scan line; and a fifth transistor coupled between the first node and the first driving power source, the fifth transistor being configured to turn off when an emission control signal is supplied to an ith emission control line.

In an embodiment, the first transistor, the second transistor, and the fifth transistor are P-type transistors, and the third transistor and the fourth transistor are N-type oxide semiconductor transistors.

In an embodiment, the pixel circuit further includes: a sixth transistor coupled between the second electrode of the first transistor and an anode electrode of the organic light emitting diode, the sixth transistor being configured to turn off when the emission control signal is supplied to the ith emission control line; and a seventh transistor coupled between the anode electrode of the organic light emitting diode and the initialization power source.

In an embodiment, the seventh transistor is a P-type transistor, and is configured to turn on when the scan signal is supplied to the ith first scan line.

In an embodiment, the seventh transistor is an N-type transistor, and is configured to turn on when the emission control signal is supplied to the ith emission control line.

In an embodiment, the seventh transistor is an N-type transistor, and an ith third scan line is coupled to a gate electrode of the seventh transistor, and a scan signal supplied to the ith third scan line overlaps with the emission control signal supplied to the ith emission control line.

In an embodiment, the pixel circuit includes: an eleventh transistor configured to control the amount of current supplied from the first driving power source coupled to a first electrode thereof to the organic light emitting diode, the amount of current corresponding to a voltage of an eleventh node; a twelfth transistor coupled between a twelfth node and a data line, the twelfth transistor being configured to turn on when a scan signal is supplied to an ith scan line; a thirteenth transistor coupled between the twelfth node and an anode electrode of the organic light emitting diode, the thirteenth transistor being configured to turn off when an emission control signal is supplied to an (i−1)th emission control line; a fourteenth transistor coupled between the eleventh node and the first electrode of the eleventh transistor, the fourteenth transistor being configured to turn on when a scan signal is supplied to an ith second scan line; a fifteenth transistor coupled between an initialization power source and the anode electrode of the organic light emitting diode, the fifteenth transistor being configured to turn on when the scan signal is supplied to an ith first scan line; a sixteenth transistor coupled between the first driving power source and the first electrode of the eleventh transistor, the sixteenth transistor being configured to turn off when an emission control signal is supplied to an ith emission control line; and a storage capacitor coupled between the eleventh node and the twelfth node.

In an embodiment, the eleventh to sixteenth transistors are N-type transistors.

In an embodiment, the organic light emitting display device further includes: third scan lines in parallel to the first scan lines, the third scan lines being coupled to the pixels; and a third scan driver configured to supply scan signals to the third scan lines during the second period when the organic light emitting display device is driven at the second driving frequency.

In an embodiment, the third scan driver is configured to supply no scan signal to the third scan lines during the period in which the organic light emitting display device is driven at the first driving frequency and in the first period.

In an embodiment, each of pixels at an ith (i being a natural number) horizontal line includes: an organic light emitting diode; a first transistor coupled to a first driving power source via a first node coupled to a first electrode thereof, the first transistor being configured to control an amount of current supplied to the organic light emitting diode, the amount of current corresponding to a voltage of a second node; a second transistor coupled between a data line and the first node, the second transistor being configured to turn on when a scan signal is supplied to an ith first scan line; a third transistor coupled between a second electrode of the first transistor and the second node, the third transistor being configured to turn on when a scan signal is supplied to an ith second scan line; a fourth transistor coupled between the second node and an initialization power source, the fourth transistor being configured to turn on when a scan signal is supplied to an (i−1)th second scan line; a fifth transistor coupled between the first node and the first driving power source, the fifth transistor being configured to turn off when an emission control signal is supplied to an ith emission control line; and an eighth transistor coupled between the first node and a reference power source, the eighth transistor being configured to turn on when a scan signal is supplied to an ith third scan line.

In an embodiment, the reference power source is set to a voltage different from that of the first driving power source.

In an embodiment, an organic light emitting display device including: a pixel including: a first transistor configured to control an amount of current flowing from a first driving power source to a second driving power source via an organic light emitting diode; a second transistor coupled between a data line and a first electrode of the first transistor, the second transistor being configured to turn on when a scan signal is supplied to an ith (i being a natural number) first scan line; and a third transistor coupled between a second electrode and a gate electrode of the first transistor, the third transistor being configured to turn on when a scan signal is supplied to an ith second scan line; a first scan driver configured to supply a scan signal to an ith first scan line during a first period and a second period of one frame period; a second scan driver configured to supply a scan signal to the ith second scan line during the first period; and a data driver configured to supply a data signal to the data line during the first period and to supply a voltage of a reference power source during the second period.

In an embodiment, the third transistor is set as an N-type oxide semiconductor transistor.

In an embodiment, the second period is longer than the first period.

In an embodiment, the pixel further includes: a fourth transistor coupled between the gate electrode of the first transistor and an initialization power source, the fourth transistor being configured to turn on when a scan signal is supplied to an (i−1)th second scan line; and a fifth transistor coupled between the first electrode of the first transistor and the first driving power source, the fifth transistor being configured to turn off when an emission control signal is supplied to an ith emission control line.

In an embodiment, the organic light emitting display device further includes an emission driver configured to supply the emission control signal to the ith emission control line during the first period and the second period.

According to an embodiment of the present disclosure, there is provided an organic light emitting display device driven at a first driving frequency or a second driving frequency lower than the first driving frequency, the organic light emitting display device including: pixels coupled to first scan lines, second scan lines, and data lines; a first scan driver configured to supply scan signals to the first scan lines; a second scan driver configured to supply scan signals to the second scan lines; and a timing controller configured to supply a same number of gate start pulses to the first scan driver and the second scan driver when the organic light emitting display device is driven at the first driving frequency, and to supply different numbers of gate start pulses to the first scan driver and the second scan driver when the organic light emitting display device is driven at the second driving frequency.

In an embodiment, when the organic light emitting display device is driven at the second driving frequency, the timing controller is configured to: supply I (I being a natural number of 2 or more) gate start pulses to the first scan driver during one frame period; and supply p (p being a natural number smaller than I) gate start pulses to the second scan driver during the one frame period.

BRIEF DESCRIPTION OF THE DRAWINGS

Example embodiments will now be described more fully hereinafter with reference to the accompanying drawings; however, the present disclosure may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

Figure 1:
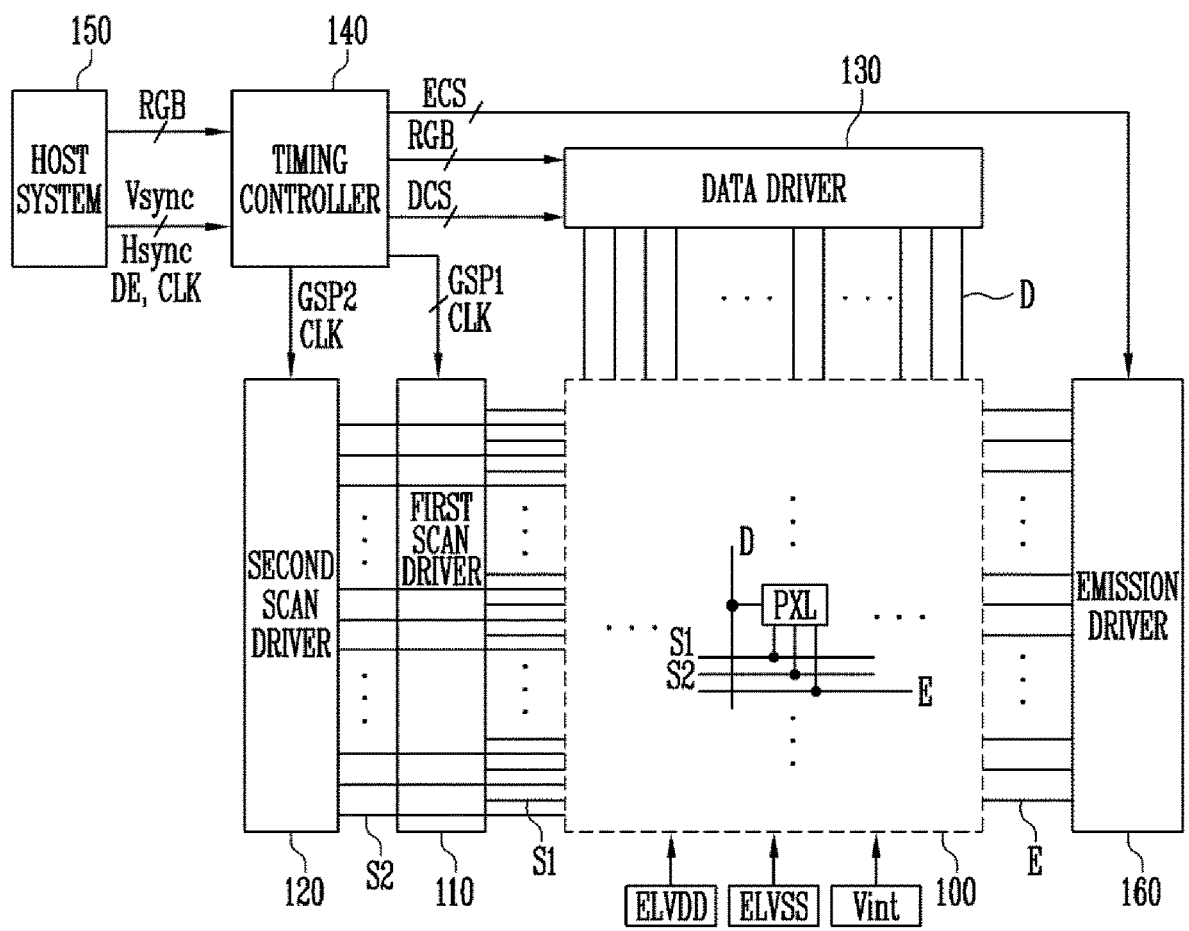
FIG. 1 is a diagram schematically illustrating an organic light emitting display device according to an embodiment of the present disclosure.

FIG. 1 is a diagram schematically illustrating an organic light emitting display device according to an embodiment of the present disclosure.

Referring to FIG. 1, the organic light emitting display device according to the embodiment of the present disclosure includes a pixel unit 100, a first scan driver 110, a second scan driver 120, a data driver 130, a timing controller 140, a host system 150, and an emission driver 160.

The host system 150 supplies image data RGB to the timing controller 140 through a set or predetermined interface. Also, the host system 150 may supply timing signals Vsync, Hsync, DE, and CLK to the timing controller 140.

The timing controller 140 generates a data driving control signal DCS and an emission driving control signal ECS, based on the image data RGB and the timing signals, such as a vertical synchronization signal Vsync, a horizontal synchronization signal Hsync, a data enable signal DE, and a clock signal CLK, which are supplied from the host system 150. The data driving control signal DCS generated by the timing controller 140 is supplied to the data driver 130, and the emission driving control signal ECS generated by the timing controller 140 is supplied to the emission driver 160. Also, the timing controller 140 supplies a gate start pulse GSP1 or GSP2 and clock signals CLK to the first scan driver 110 and the second scan driver 120, based on the timing signals. In addition, the timing controller 140 realigns data RGB supplied from the outside and supplies the realigned data RGB to the data driver 130.

The data driving control signal DCS includes a source start pulse and clock signals. The source start pulse controls a sampling start time of data. The clock signals are used to control a sampling operation.

The emission driving control signal ECS includes an emission start pulse and clock signals. The emission start pulse controls a first timing of an emission control signal. The clock signals are used to shift (e.g., shift in time) the emission start pulse.

A first gate start pulse GSP1 controls a first timing of a scan signal supplied from the first scan driver 110. Clock signals CLK are used to shift (e.g., shift in time) the first gate start pulse GSP1.

A second gate start pulse GSP2 controls a first timing of a scan signal supplied from the second scan driver 120. Clock signals CLK are used to shift (e.g., shift in time) the second gate start pulse GSP2.

The data driver 130 supplies a data signal to data lines D, corresponding to the data driving control signal DCS. The data signal supplied to the data lines D is supplied to pixels PXL selected by a scan signal.

When the organic light emitting display device is driven at a first driving frequency, the data driver 130 supplies a data signal to the data lines D during one frame period. In this case, the data signal supplied to the data lines D may be supplied to be synchronized with (e.g., be at the same time as or overlapping) scan signals supplied to first scan lines S1 and second scan lines S2.

When the organic light emitting display device is driven at a second driving frequency lower than the first driving frequency, the data driver 130 supplies a data signal to the data lines during a first period in one frame period, and supplies a voltage of a reference power source to the data lines D during a second period, and not the first period. Here, the voltage of the reference power source may be set to a specific voltage within a voltage range of a data signal. Additionally, the first period refers to a period in which scan signals are supplied to the first scan lines S1 and the second scan lines S2. In addition, the second period refers to a period in which scan signals are supplied to the first scan lines S1, and not the second scan lines S2.

The first scan driver 110 supplies scan signals to the first scan lines S1, corresponding to the first gate start pulse GSP1. In an embodiment, the first scan driver 110 may sequentially supply the scan signals to the first scan lines S1. Here, the scan signals supplied from the first scan driver 110 are set to a gate-on voltage such that transistors included in the pixels PXL can be turned on.

The second scan driver 120 supplies scan signals to the second scan lines S2, corresponding to the second gate start pulse GSP2. In an embodiment, the second scan driver 120 may sequentially supply the scan signals to the second scan lines S2. Here, the scan signals supplied from the second scan driver 120 are set to the gate-on voltage such that the transistors included in pixels PXL can be turned on.

The first scan driver 110 and the second scan driver 120 may control scan signals supplied to the scan lines S1 and S2, corresponding to a driving frequency. In an embodiment, when the organic light emitting display device is driven at the first driving frequency, the first scan driver 110 may sequentially supply one or more scan signals to each of the first scan lines S1 during one frame period. Similarly, when the organic light emitting display device is driven at the first driving frequency, the second scan driver 120 may sequentially supply one or more scan signals to each of the second scan lines S2 during one frame period. Here, a scan signal supplied to an ith (i is a natural number) first scan line S1$i$ overlaps with that supplied to an ith second scan line S2$i$. In other words, the scan signal supplied to the ith first scan line S1$i$ is supplied at the same time as the scan signal supplied to the ith second scan line S2$i$ (i.e., the scan signals are supplied to be synchronized with each other).

When the organic light emitting display device is driven at the second driving frequency, the first scan driver 110 supplies scan signals to the first scan lines S1 during the first period and the second period. In an embodiment, the first scan driver 110 may supply j (j is a natural number of 2 or more) to each of the first lines S1 during the first period and the second period. Here, the scan signals supplied to each of the first scan lines S1 may be repeatedly supplied for every set or predetermined period.

When the organic light emitting display device is driven at the second driving frequency, the second scan driver 120 supplies scan signals to the second scan lines S2 during the first period. In an embodiment, the second scan driver 120 supplies k (k is a natural number smaller than j) scan signals to each of the second scan lines S2 during the first period. Here, the scan signal supplied to the ith first scan line S1$i$ overlaps with that supplied to the ith second scan line S2$i$.

The emission driver 160 supplies emission control signals to emission control lines E, corresponding to the emission driving control signal ECS. In an embodiment, the emission driver 160 may sequentially supply the emission control signals to the emission control lines E. When the emission control signals are sequentially supplied to the emission control lines E, the pixels PXL emit no light in units of horizontal lines. To this end, the emission control signals are set to a gate-off voltage such that the transistors included in the pixels PXL can be turned off. Additionally, the emission driver 160 supplies an emission control signal to an ith emission control line Ei to overlap with scan signals supplied to an (i−1)th first scan line S1$i$−1 and the ith first scan line S1$i$.

The pixel unit 100 includes pixels PXL that are coupled to the data lines D, the scan lines S1 and S2, and the emission control lines E. The pixels PXL receive a first driving power source ELVDD, a second driving power source ELVSS, and an initialization power source Vint, which are supplied from the outside (e.g., external to the pixel unit 100).

Each of the pixels PXL is selected when scan signals are supplied to scan lines S1 and S2 coupled thereto to receive a data signal supplied from a data line D. The pixel PXL receiving the data signal controls the amount of current flowing from the first driving power source ELVDD to the second driving power source ELVSS via an organic light emitting diode, corresponding to the data signal. At this time, the organic light emitting diode generates light with a luminance (e.g., a predetermined luminance) corresponding to the amount of the current. In addition, the emission time of each of the pixels PXL is controlled by an emission control signal supplied from an emission control line E coupled to the pixel PXL.

Additionally, each of the pixels PXL may be coupled to one or more first scan lines S1, one or more second scan lines S2, and one or more emission control lines E, corresponding to circuit structures thereof. That is, in the embodiment of the present disclosure, signal lines S1, S2, E, and D coupled to the pixel PXL may be variously set corresponding to circuit structures of the pixel PXL.

Figure 2:
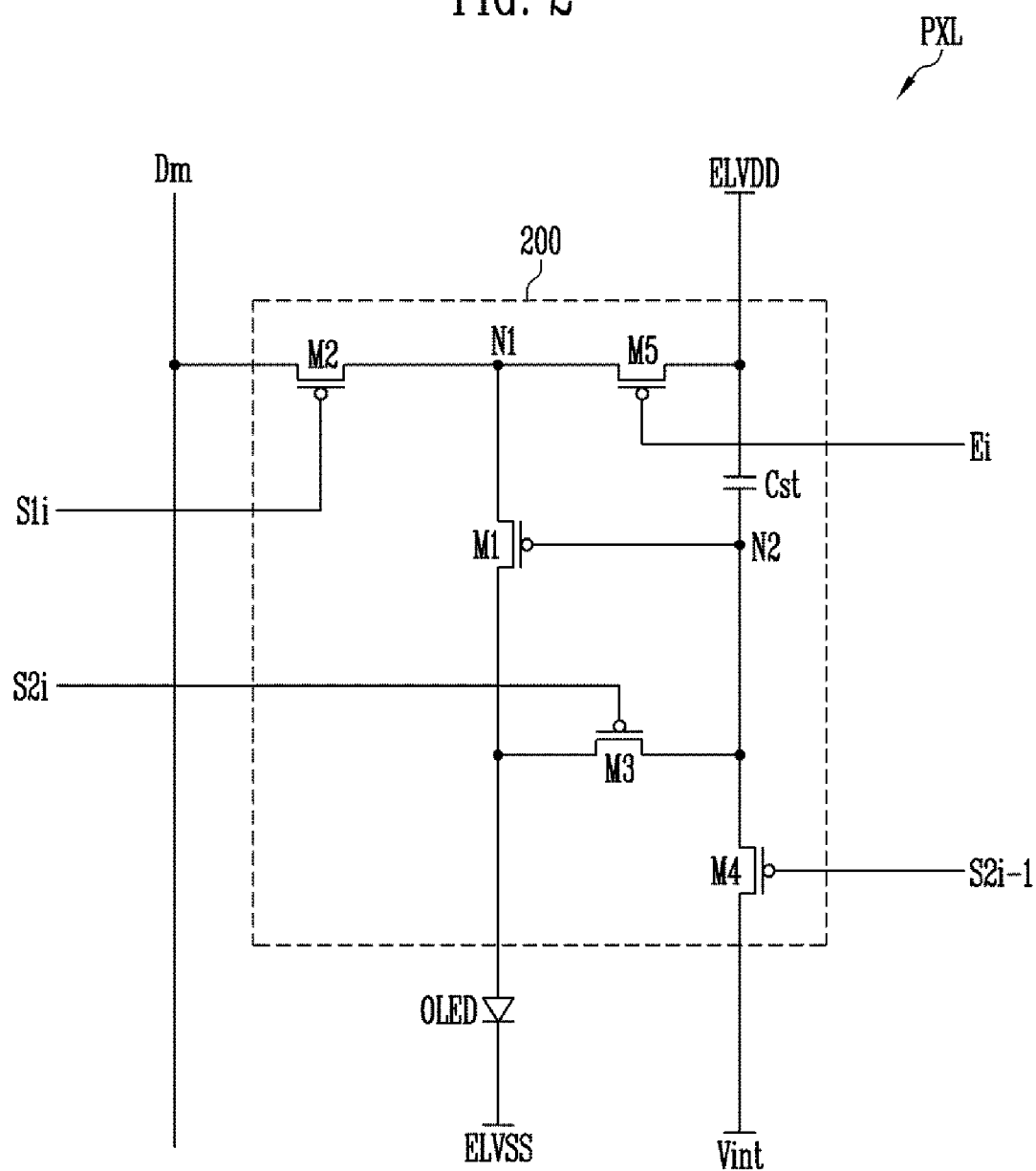
FIG. 2 is a circuit diagram illustrating an embodiment of a pixel shown in FIG. 1.

FIG. 2 is a circuit diagram illustrating an embodiment of the pixel shown in FIG. 1. For convenience of description, a pixel that is located on an ith horizontal line and is coupled to an mth data line Dm is illustrated in FIG. 2.

Referring to FIG. 2, the pixel PXL according to the embodiment of the present disclosure includes an organic light emitting diode OLED and a pixel circuit 200 for controlling the amount of current supplied to the organic light emitting diode OLED.

An anode electrode of the organic light emitting diode OLED is coupled to the pixel circuit 200, and a cathode electrode of the organic light emitting diode OLED is coupled to the second driving power source ELVSS. The organic light emitting diode OLED generates light with a luminance (e.g., a predetermined luminance) corresponding to the amount of current supplied from the pixel circuit 200.

The pixel circuit 200 controls the amount of current flowing from the first driving power source ELVDD to the second driving power source ELVSS via the organic light emitting diode OLED, corresponding to a data signal. To this end, the pixel circuit 200 includes first to fifth transistors M1 to M5 and a storage capacitor Cst.

A first electrode of the first transistor (or driving transistor) M1 is coupled to a first node N1, and a second electrode of the first transistor M1 is coupled to the anode electrode of the organic light emitting diode OLED. In addition, a gate electrode of the first transistor M1 is coupled to a second node N2. The first transistor M1 controls the amount of the current flowing from the first driving power source ELVDD to the second driving power source ELVSS via the organic light emitting diode OLED, corresponding to a voltage of the second node N2. To this end, the first driving power source ELVDD is set to a voltage higher than that of the second driving power source ELVSS.

The second transistor M2 is coupled between a data line Dm and the first node N1. In addition, a gate electrode of the second transistor M2 is coupled to an ith first scan line S1$i$. The second transistor M2 is turned on when a scan signal is supplied to the ith first scan line S1$i$ to allow the data line Dm and the first node N1 to be electrically coupled to each other.

The third transistor M3 is coupled between the second electrode of the first transistor M1 and the second node N2. In addition, a gate electrode of the third transistor M3 is coupled to an ith second scan line S2$i$. The third transistor M3 is turned on when a scan signal is supplied to the ith second scan line S2$i$ to allow the second electrode of the first transistor M1 and the second node N2 to be electrically coupled to each other. Therefore, when the third transistor M3 is turned on, the first transistor M1 is diode-coupled.

The fourth transistor M4 is coupled between the second node N2 and the initialization power source Vint. In addition, a gate electrode of the fourth transistor M4 is coupled to an (i−1)th second scan line S2$i$−1. The fourth transistor M4 is turned on when a scan signal is supplied to the (i−1)th second scan line S2$i$−1 to supply a voltage of the initialization power source Vint to the second node N2. Here, the voltage of the initialization power source Vint is set to a voltage lower than that of the data signal supplied to the data line Dm.

The fifth transistor M5 is coupled between the first driving power source ELVDD and the first node N1. In addition, a gate electrode of the fifth transistor M5 is coupled to an emission control line Ei. The fifth transistor M5 is turned off when an emission control signal is supplied to the emission control line Ei, and is turned on otherwise.

The storage capacitor Cst is coupled between the first driving power source ELVDD and the second node N2. The storage capacitor Cst stores a voltage applied to the second node N2.

The first to fifth transistors M1 to M5 are formed as P-type transistors. In an embodiment, the first to fifth transistors M1 to M5 may be formed as P-type poly-silicon semiconductor transistors.

Figure 3:
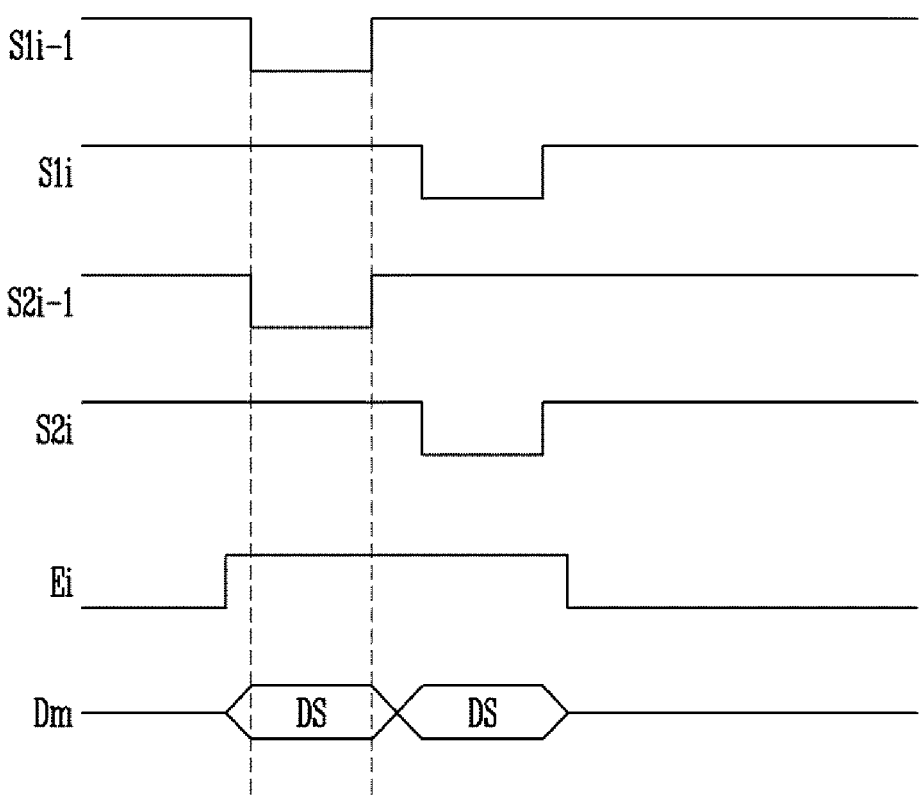
FIG. 3 is a waveform diagram illustrating an embodiment of a driving method of the pixel shown in FIG. 2.

FIG. 3 is a waveform diagram illustrating an embodiment of a driving method of the pixel shown in FIG. 2.

Referring to FIG. 3, an emission control signal is first supplied to the emission control line Ei. When the emission control signal is supplied to the emission control line Ei, the fifth transistor M5 is turned off. When the fifth transistor M5 is turned off, the electrical coupling between the first node N1 and the first driving power source ELVDD is interrupted, and accordingly, the pixel PXL is set to a non-emission state.

After that, a scan signal is supplied to the (i−1)th second scan line S2$i$−1. When the scan signal is supplied to the (i−1)th second scan line S2$i$−1, the fourth transistor M4 is turned on. When the fourth transistor M4 is turned on, the voltage of the initialization power source Vint is supplied to the second node N2.

After the voltage of the initialization power source Vint is supplied to the second node N2, a scan signal is supplied to each of the ith first scan line S1$i$ and the ith second scan line S2$i$. When the scan signal is supplied to the ith second scan line S2$i$, the third transistor M3 is turned on. When the third transistor M3 is turned on, the first transistor M1 is diode-coupled.

If the scan signal is supplied to the ith first scan line S1$i$, the second transistor M2 is turned on. When the second transistor M2 is turned on, a data signal Ds from the data line Dm is supplied to the first node N1. At this time, because the second node N2 is initialized to the voltage of the initialization power source Vint, which is lower than the voltage of the data signal DS, the first transistor M1 is turned on.

If the first transistor M1 is turned on, the data signal DS supplied to the first node N1 is supplied to the second node N2 via the diode-coupled first transistor M1. Then, a voltage, corresponding to the data signal DA and a threshold voltage of the first transistor M1, is applied to the second node N2. At this time, the storage capacitor Cst stores the voltage of the second node N2.

The supply of the emission control signal to the emission control line Ei is stopped after the voltage corresponding to the data signal DS and the threshold voltage of the first transistor M1 is stored in the storage capacitor Cst. When the supply of the emission control signal to the emission control line Ei is stopped, the fifth transistor M5 is turned on. When the fifth transistor M5 is turned on, the first driving power source ELVDD and the first node N1 are electrically coupled to each other. At this time, the first transistor M1 controls the amount of current flowing from the first driving power source ELVDD to the second driving power source ELVSS via the organic light emitting diode OLED, corresponding to the voltage of the second node N2. Then, the organic light emitting diode OLED generates light with a luminance corresponding to the amount of the current.

Figure 4:
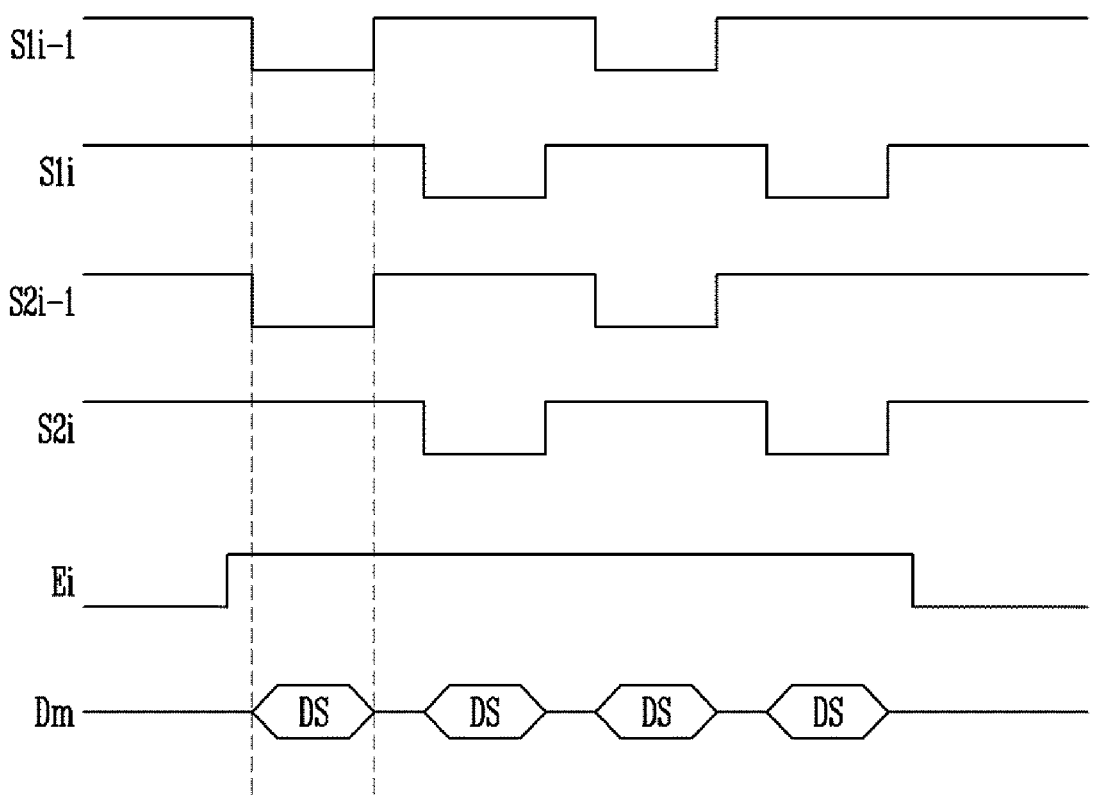
FIG. 4 is a waveform diagram illustrating another embodiment of the driving method of the pixel shown in FIG. 2.

Actually, the pixel PXL of the present disclosure is driven while repeating the above-described process. Additionally, for convenience of description, a case where one scan signal is supplied to each of the scan lines S1 and S2 is illustrated in FIG. 3, but the present disclosure is not limited thereto. In an embodiment, a plurality of scan signals may be supplied each of the scan lines S1 and S2 as shown in FIG. 4. In this case, an operation process is substantially identical to that of FIG. 3, and therefore, its detailed description may not be repeated. In the following description, it will be assumed that one scan signal is supplied to each of the scan lines S1 and S2.

Figure 5:
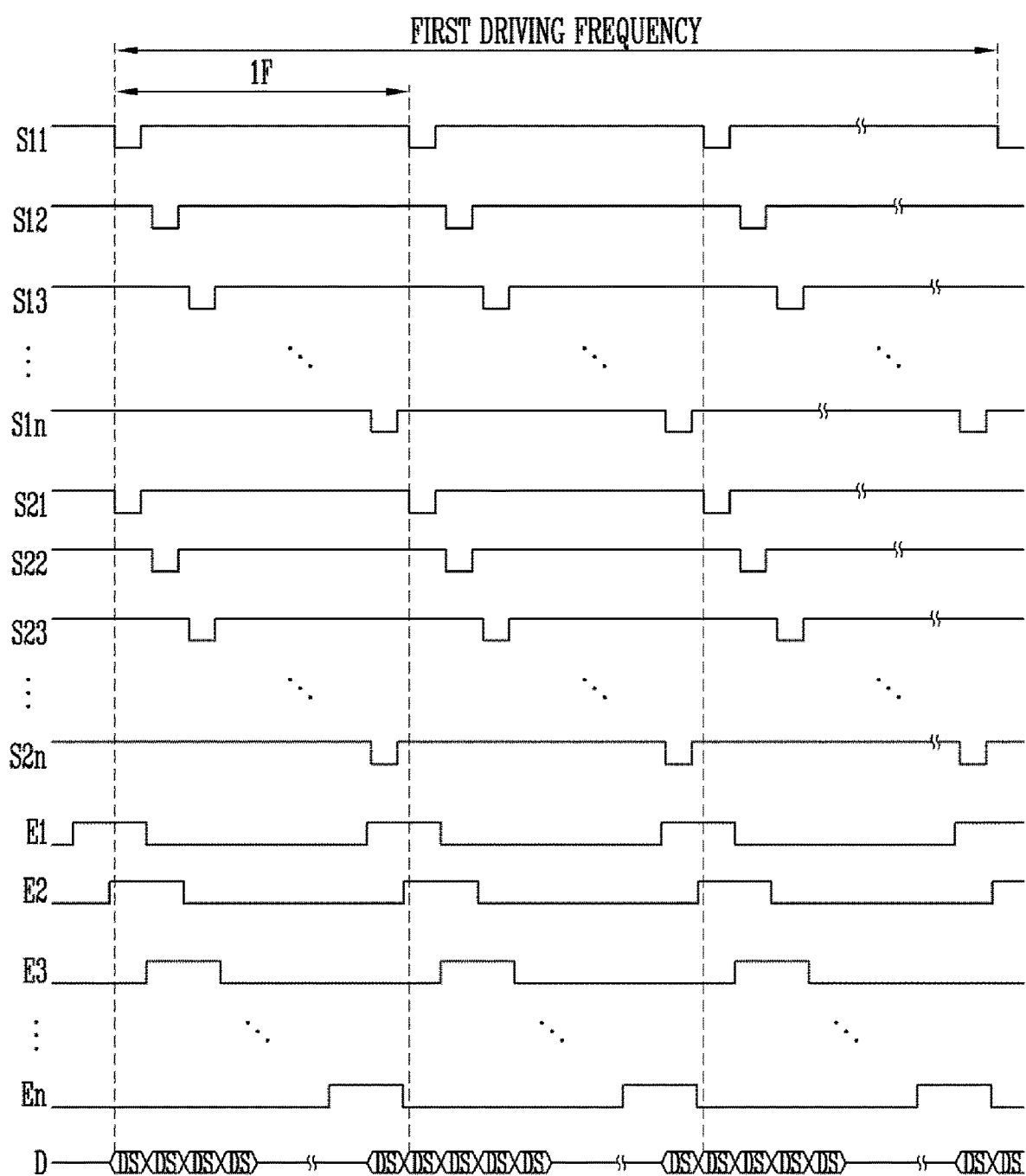
FIG. 5 is a waveform diagram illustrating an embodiment of a driving method when the pixel shown in FIG. 2 is driven at a first driving frequency.

FIG. 5 is a waveform diagram illustrating an embodiment of a driving method when the pixel shown in FIG. 2 is driven at the first driving frequency. Here, the first driving frequency may be set to a frequency of 60 Hz or more.

Referring to FIG. 5, when the organic light emitting display device is driven at the first frequency, scan signals are sequentially supplied to first scan lines S11 to S1n and second scan lines S21 to S2n during one frame period 1F. Here, a scan signal supplied to the ith first scan line S1i overlaps with that supplied to the ith second scan line S2i.

In addition, when the organic light emitting display device is driven at the first frequency, emission control signals are sequentially supplied to emission control lines E1 to En during the one frame period 1F. Here, an emission control signal supplied to the ith emission control line Ei overlaps with scan signals supplied to the (i−1)th first scan line S1i−1 and the ith first scan line S1i. A data signal DS is supplied to the data lines Dm to be synchronized with the scan signals.

Then, a voltage corresponding to the data signal DS is stored in each of the pixels PXL as described in FIGS. 2 and 3. In addition, each of the pixels PXL generates light with a luminance (e.g., a predetermined luminance) corresponding to the data signal DS, so that the pixel unit 100 can display an image (e.g., a predetermined image).

Figure 6:
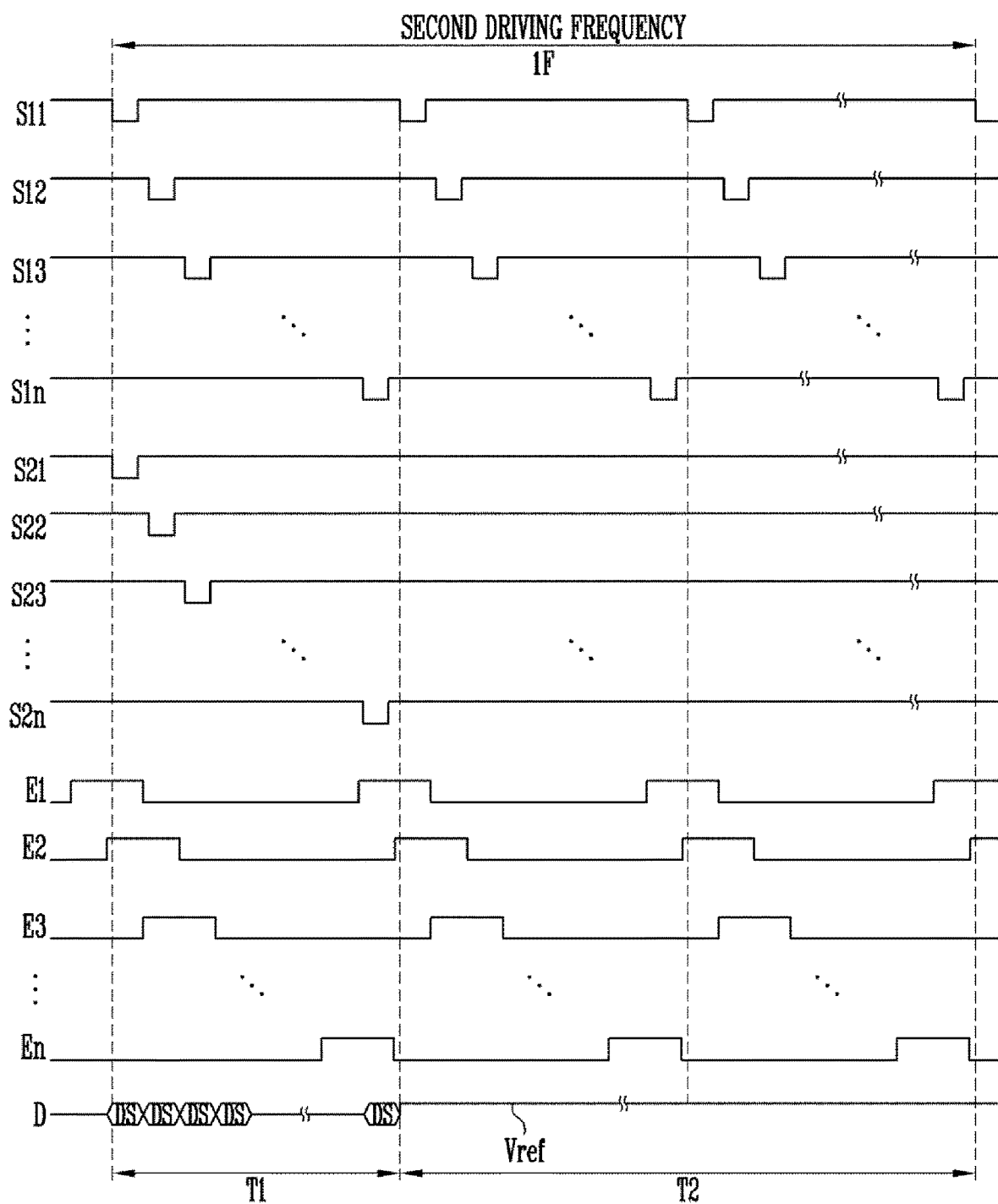
FIG. 6 is a waveform diagram illustrating an embodiment of a driving method when the pixel shown in FIG. 2 is driven at a second driving frequency.

FIG. 6 is a waveform diagram illustrating an embodiment of a driving method when the pixel shown in FIG. 2 is driven at the second driving frequency. Here, the second driving frequency may be set to a frequency of less than 60 Hz.

Referring to FIG. 6, when the organic light emitting display device is driven at the second driving frequency, one frame period 1F is divided into a first period T1 and a second period T2. Here, the second period T2 may be set as a period wider (e.g., having a longer duration) than the first period T1.

During the first period T1, scan signals are sequentially supplied to the first scan lines S11 to S1n and the second scan lines S21 to S2n. Here, a scan signal supplied to the ith first scan line S1i overlaps with that supplied to the ith second scan line S2i.

In addition, during the first period T1, emission control signals are sequentially supplied to the emission control lines E1 to En. Here, an emission control signal supplied to the ith emission control line Ei overlaps with scan signals supplied to the (i−1)th first scan line S1i−1 and the ith first scan line S1i. A data signal DS is supplied to the data lines D to be synchronized with the scan signals. Then, during the first period T1, a voltage corresponding to the data signal DS is stored in each of the pixels PXL.

During the second period T2, a plurality of scan signals are supplied to each of the first scan lines S11 to S1n. Here, the scan signals supplied to each of the first scan lines S11 to S1n may be supplied for every set or predetermined period. In an embodiment, during the second period T2, scan signals may be supplied several times to the first scan lines S1l to S1n while being sequentially repeated.

During the second period T2, a plurality of emission control signals are supplied to the emission control lines E1 to En. Here, an emission control signal supplied to the ith emission control line Ei may be supplied to overlap with scan signals supplied to the (i−1)th first scan line S1i−1 and the ith first scan line S1i. In addition, during the second period T2, a voltage of a reference power source Vref is supplied to the data lines D.

The driving method will be described in conjunction with FIGS. 2 and 6. During the first period T1, a voltage of the data signal DS is stored in each of the pixels PXL. Then, the first transistor M1 supplies, to the organic light emitting diode OLED, a current (e.g., a predetermined current) corresponding to a difference between a voltage of the first driving power source, applied to the first node N1, and a voltage of the data signal DS, applied to the second node N2.

During a partial period of the second period T2, an emission control signal is supplied to the ith emission control line Ei. When the emission control signal is supplied to the ith emission control line Ei, the fifth transistor M5 is turned off. Then, the pixel PXL is set to the non-emission state.

After that, a scan signal is supplied to the ith first scan line S1i. When the scan signal is supplied to the ith first scan line S1i, the second transistor M2 is turned on. When the second transistor M2 is turned on, the voltage of the reference power source Vref is supplied from the data line Dm to the first node N1. Then, characteristic curves of the first transistor M1 are changed, and accordingly, the display quality of the organic light emitting display device can be improved.

Figure 7:
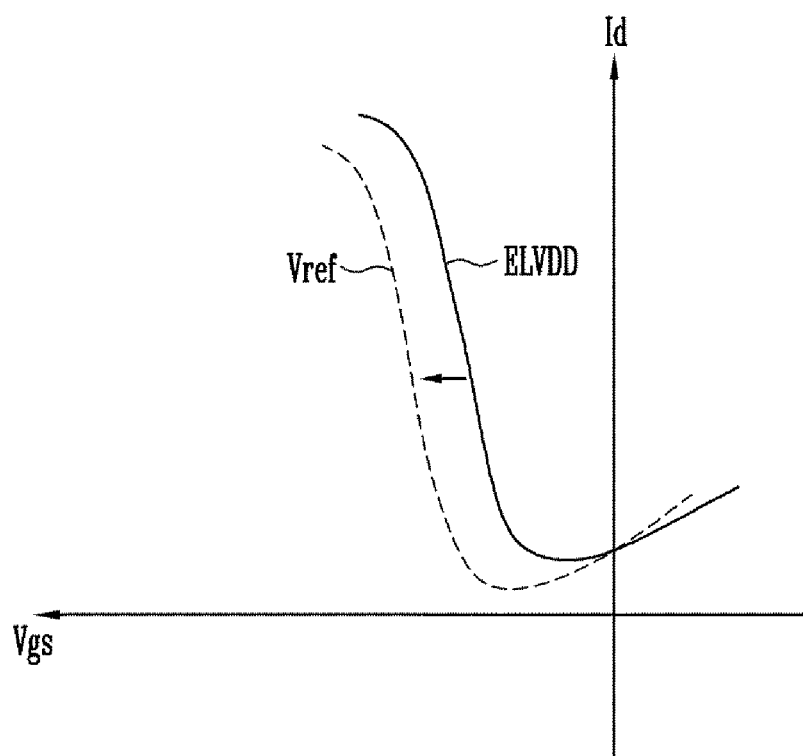
FIG. 7 is a diagram illustrating changes in characteristics of a driving transistor included in the pixel.

For example, characteristics of the first transistor M1 are set to a specific state as shown in FIG. 7, corresponding to the voltage of the first driving power source ELVDD, applied to the first node N1, during a period in which the pixel PXL emits light. When the characteristics of the first transistor M1 are set to the specific state during one frame period, an image with a desired luminance may not be displayed corresponding to the data signal DS during at least an early period of a next frame period.

When the organic light emitting display device is driven at the second driving frequency, one frame period 1F is set relatively widely (e.g., relative to when the organic light emitting display device is driven at the first driving frequency). In an embodiment, when the first driving frequency is set to 60 Hz, the one frame period 1F may be set to 1/60 s (second). When the second driving frequency is set to 10 Hz, the one frame period 1F may be set to 1/10 s (second). Therefore, when the characteristics of the first transistor M1 are fixed to the specific state during one frame period when the organic light emitting display device is driven at the second driving frequency, flickers may be generated.

On the other hand, in the present disclosure, when the voltage of the reference power source Vref is supplied to the first electrode of the first transistor M1, the characteristics of the first transistor M1 are changed. Actually, in the present disclosure, the voltage of the reference power source Vref is periodically supplied to the first electrode of the first transistor M1 during the second period T2, and accordingly, it is possible to prevent the characteristics of the first transistor M1 from being fixed to the specific state.

To this end, the voltage of the reference power source Vref may be set to a specific voltage within a voltage range of the data signal. In addition, the voltage of the reference power source Vref may be set to a voltage different from that of the first driving power source ELVDD, for example, a voltage higher than that of the first driving power source ELVDD. For example, the voltage of the reference power source Vref may be set to a voltage equal to or greater than a half of the voltage range of the data signal, for example, a data signal of a black gray level.

When scan signals are sequentially supplied to the first scan lines S11 to S1n and emission control signals are sequentially supplied to the emission control lines E1 to En during the period in which the organic light emitting display device is driven at the second driving frequency, a driving condition in which the organic light emitting display device is driven at the second driving frequency may be similar or identical to that in which the organic light emitting display device is driven at the first driving frequency. Accordingly, the display quality of the organic light emitting display device can be improved.

For example, when the first driving frequency is set to 60 Hz, the pixels PXL are set to the non-emission state sixty times in one second. In addition, when the second driving frequency is set to 10 Hz, the pixels PXL are set to the non-emission state ten times in one second. When numbers of times of the pixels PXL set to the non-emission state are differently set when the organic light emitting display device is driven at the first driving frequency and the second driving frequency, a luminance difference, and/or the like may be recognized by an observer even when the same image is displayed.

On the other hand, when an emission control signal is supplied five times to each of the emission control lines E1 to En during the second period T2 when the organic light emitting display device is driven at the second driving frequency (e.g., 10 Hz), a number of times of the pixels set to the non-emission state is set identically to a number of times of the pixels set to the non-emission state when the organic light emitting display device is driven at the first driving frequency. That is, in the embodiment of the present disclosure, the driving condition in which the organic light emitting display device is driven at the second driving frequency is similar or identical to the driving condition in which the organic light emitting display device is driven at the first driving frequency, so that the display quality of the organic light emitting display device can be improved. In addition, when the organic light emitting display device is driven at the second driving frequency, the data signal DS is supplied to the data lines D during (e.g., only during) the first period T1, and accordingly, the power consumption of the organic light emitting display device can be reduced or minimized.

Figure 8:
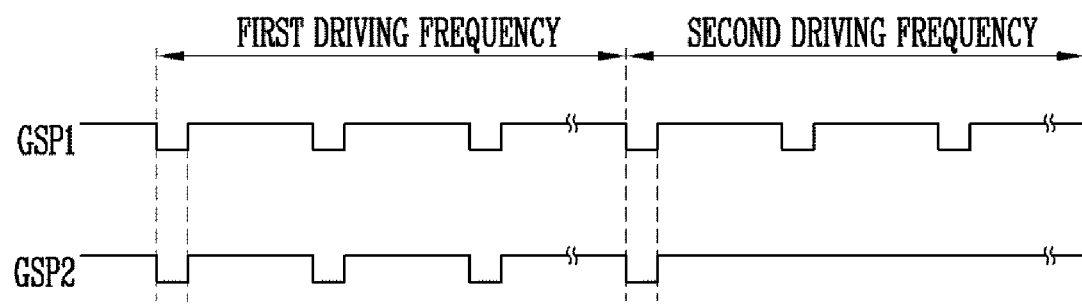
FIG. 8 is a waveform diagram illustrating gate start pulses supplied to a first scan driver and a second scan driver.

FIG. 8 is a waveform diagram illustrating gate start pulses supplied to the first scan driver and the second scan driver.

Referring to FIG. 8, when the organic light emitting display device is driven at the first driving frequency, the same number of scan signals are supplied to the first scan lines S11 to S1n and the second scan lines S21 to S2n as shown in FIG. 5. Therefore, when the organic light emitting display device is driven at the first driving frequency, a number of first gate start pulses GSP1 supplied from the timing controller 140 to the first scan driver 110 is set equal to that of second gate start pulses GSP2 supplied from the timing controller 140 to the second scan driver 120.

When the organic light emitting display device is driven at the second frequency, different numbers of scan signals are supplied to the first scan lines S11 to S1n and the second scan lines S21 to S2n as shown in FIG. 6. Therefore, when the organic light emitting display device is driven at the second frequency, a number of first gate start pulses GSP1 supplied from the timing controller 140 to the first scan driver 110 is set different from that of second gate start pulses GSP2 supplied from the timing controller 140 to the second scan driver 120. In other words, when the organic light emitting display device is driven at the second frequency, I (I is a natural number of 2 or more) first gate start pulses GSP1 are supplied to the first scan driver 110, and p (p is a natural number smaller than I) second start pulses GSP2 are supplied to the second scan driver 120.

Figure 9:
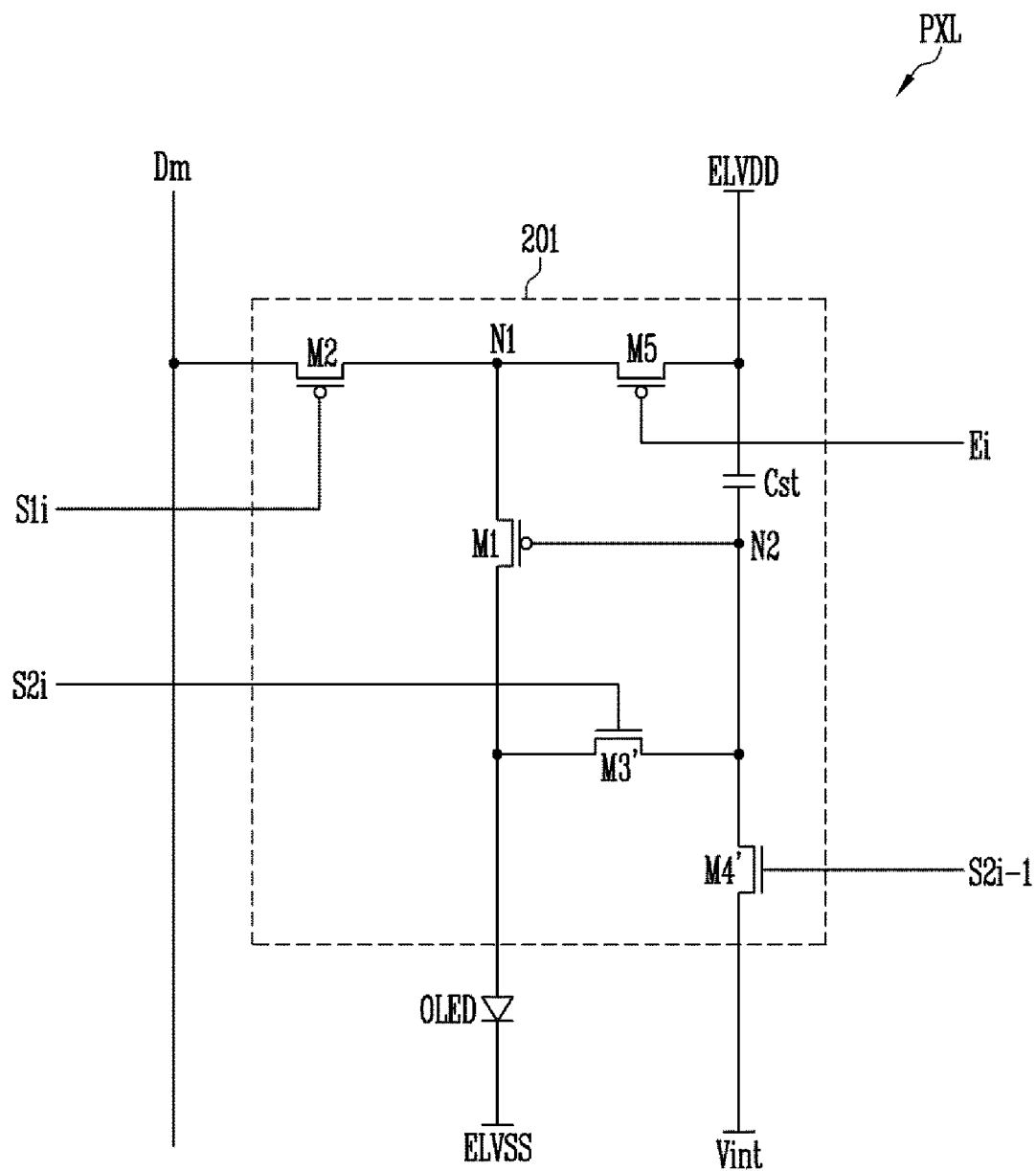
FIG. 9 is a circuit diagram illustrating another embodiment of the pixel shown in FIG. 1.

FIG. 9 is a circuit diagram illustrating another embodiment of the pixel shown in FIG. 1. In FIG. 9, components identical to those of FIG. 2 are designated by like reference numerals, and their detailed descriptions may not be repeated.

Referring to FIG. 9, the pixel PXL according to the embodiment of the present disclosure includes an organic light emitting diode OLED and a pixel circuit 201 for controlling the amount of current supplied to the organic light emitting diode OLED.

An anode electrode of the organic light emitting diode OLED is coupled to the pixel circuit 201, and a cathode electrode of the organic light emitting diode OLED is coupled to the second driving power source ELVSS. The organic light emitting diode OLED generates light with a luminance (e.g., a predetermined luminance) corresponding to the amount of current supplied from the pixel circuit 201.

The pixel circuit 201 controls the amount of current flowing from the first driving power ELVDD to the second driving power ELVSS via the organic light emitting diode OLED, corresponding to a data signal. To this end, the pixel circuit 201 includes a first transistor M1, a second transistor M2, a third transistor M3', a fourth transistor M4', a fifth transistor M5, and a storage capacitor Cst.

The third transistor M3' is coupled between a second electrode of the first transistor M1 and a second node N2. In addition, a gate electrode of the third transistor M3' is coupled to an ith second scan line S2i. The third transistor M3' is turned on when a scan signal is supplied to the ith second scan line S2i to allow the second electrode of the first transistor M1 and the second node N2 to be electrically coupled to each other. Therefore, when the third transistor M3' is turned on, the first transistor M1 is diode-coupled.

The fourth transistor M4' is coupled between the second node N2 and the initialization power source Vint. In addition, a gate electrode of the fourth transistor M4' is coupled to an (i−1)th second scan line S2i−1. The fourth transistor M4' is turned on when a scan signal is supplied to the (i−1)th second scan line S2i−1 to supply the voltage of the initialization power source Vint to the second node N2.

The third transistor M3' and the fourth transistor M4' are formed as N-type transistors. In an embodiment, the third transistor M3' and the fourth transistor M4' may be formed as N-type oxide semiconductor transistors.

The oxide semiconductor transistor can be formed through a low temperature process, and has a charge mobility lower than that of the poly-silicon semiconductor transistor. That is, the oxide semiconductor transistor has excellent off-current characteristics. Thus, when the third transistor M3' and the fourth transistor M4' are formed as oxide semiconductor transistors, leakage current from the second node N2 can be reduced or minimized, and accordingly, the display quality of the organic light emitting display device can be improved.

Figure 10:
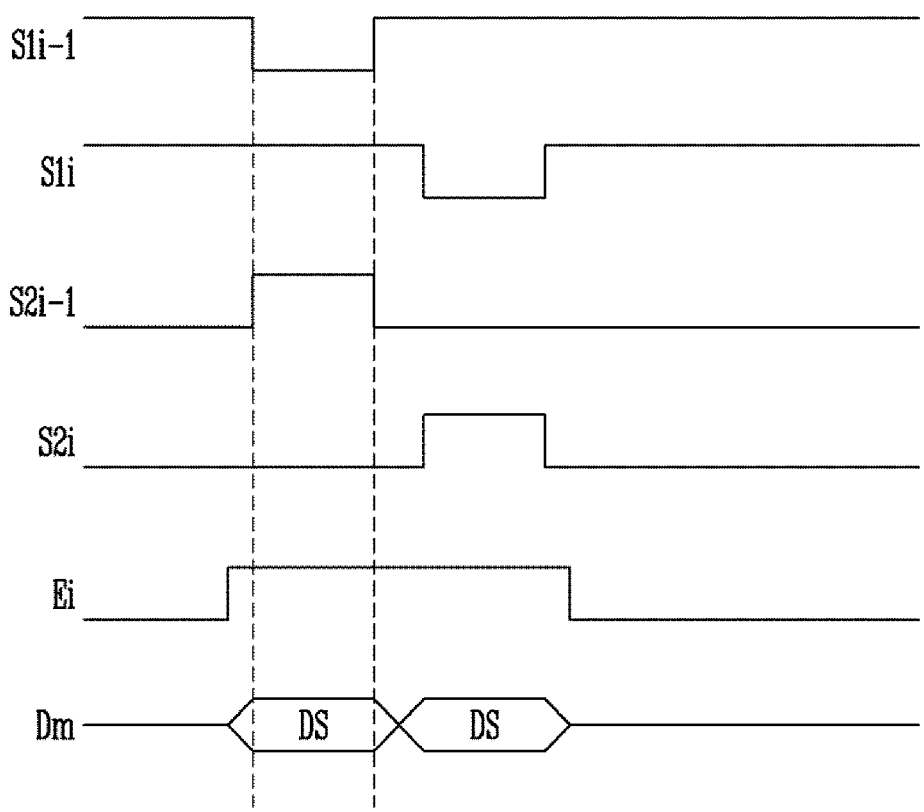
FIG. 10 is a waveform diagram illustrating an embodiment of a driving method of the pixel shown in FIG. 9.

The pixel shown in FIG. 9 is configured identically to the pixel shown in FIG. 2 except that the third transistor M3' and the fourth transistor M4' are formed as N-type transistors. In addition, the pixel shown in FIG. 9 is operated identically to the pixel shown in FIG. 2 except that, as shown in FIG. 10, scan signals supplied to the second scan lines S2 are set to a high voltage (i.e., the gate-on voltage) such that the third transistor M3' and the fourth transistor M4', which are formed as N-type transistors, can be turned on. Therefore, a detailed description of said elements may not be repeated.

Figure 11:
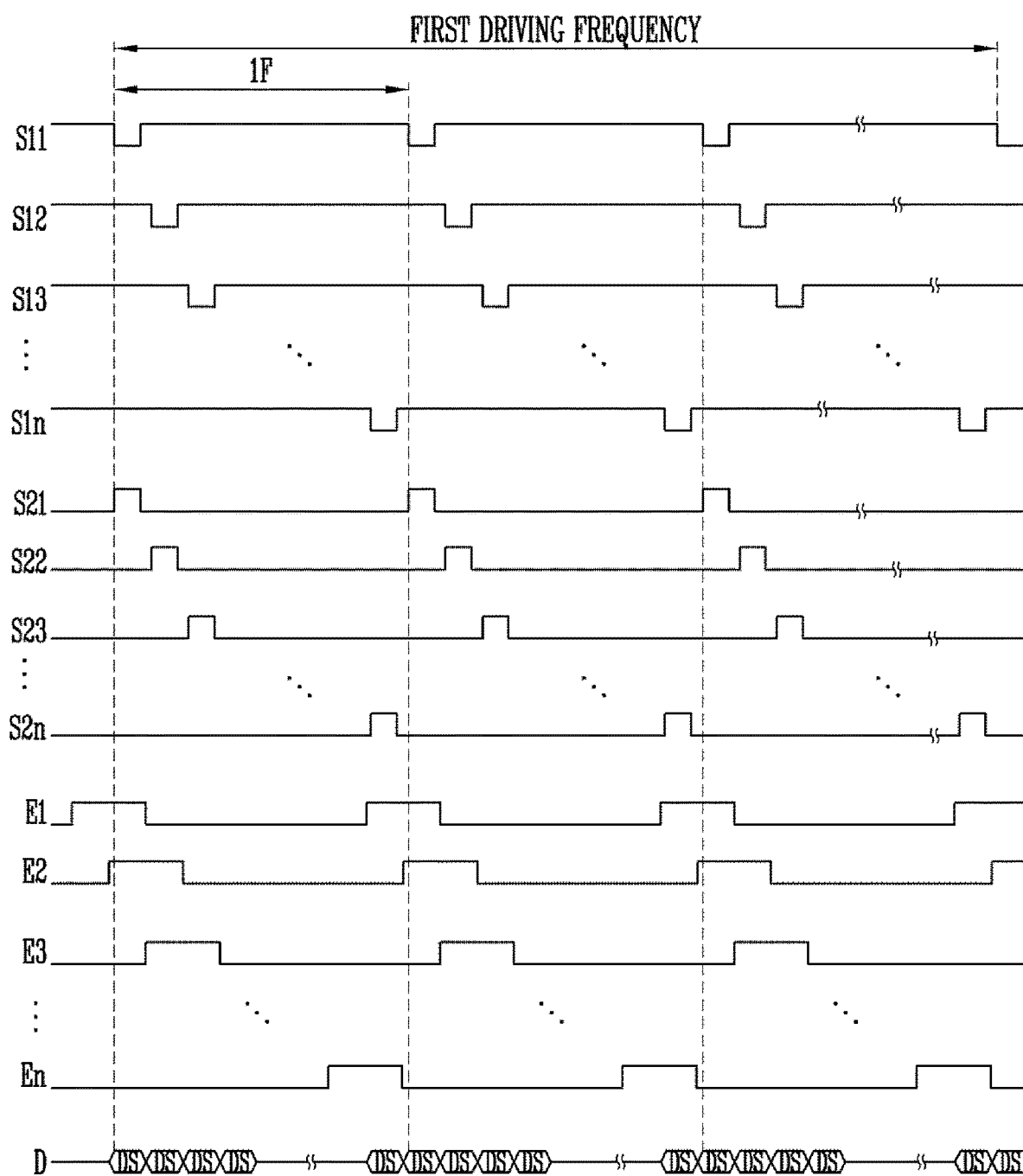
FIG. 11 is a waveform diagram illustrating an embodiment of a driving method when the pixel shown in FIG. 9 is driven at the first driving frequency.

FIG. 11 is a waveform diagram illustrating an embodiment of a driving method when the pixel shown in FIG. 9 is driven at the first driving frequency. The driving method of FIG. 11 is substantially identical to that of FIG. 5 except that only the polarity of scan signals supplied to the second scan lines S21 to S2n is changed therefore, the driving method of FIG. 11 will be briefly described.

Referring to FIG. 11, when the organic light emitting display device is driven at the first driving frequency, scan signals are sequentially supplied to the first scan lines S11 to S1n and the second scan lines S21 to S2n during one frame period 1F. In addition, when the organic light emitting display device is driven at the first driving frequency, emission control signals are sequentially supplied to the emission control lines E1 to En during the one frame period 1F.

Then, a voltage corresponding to a data signal is stored in each of the pixels PXL, and accordingly, the pixel unit 10 can display an image (e.g., a predetermined image).

Figure 12:
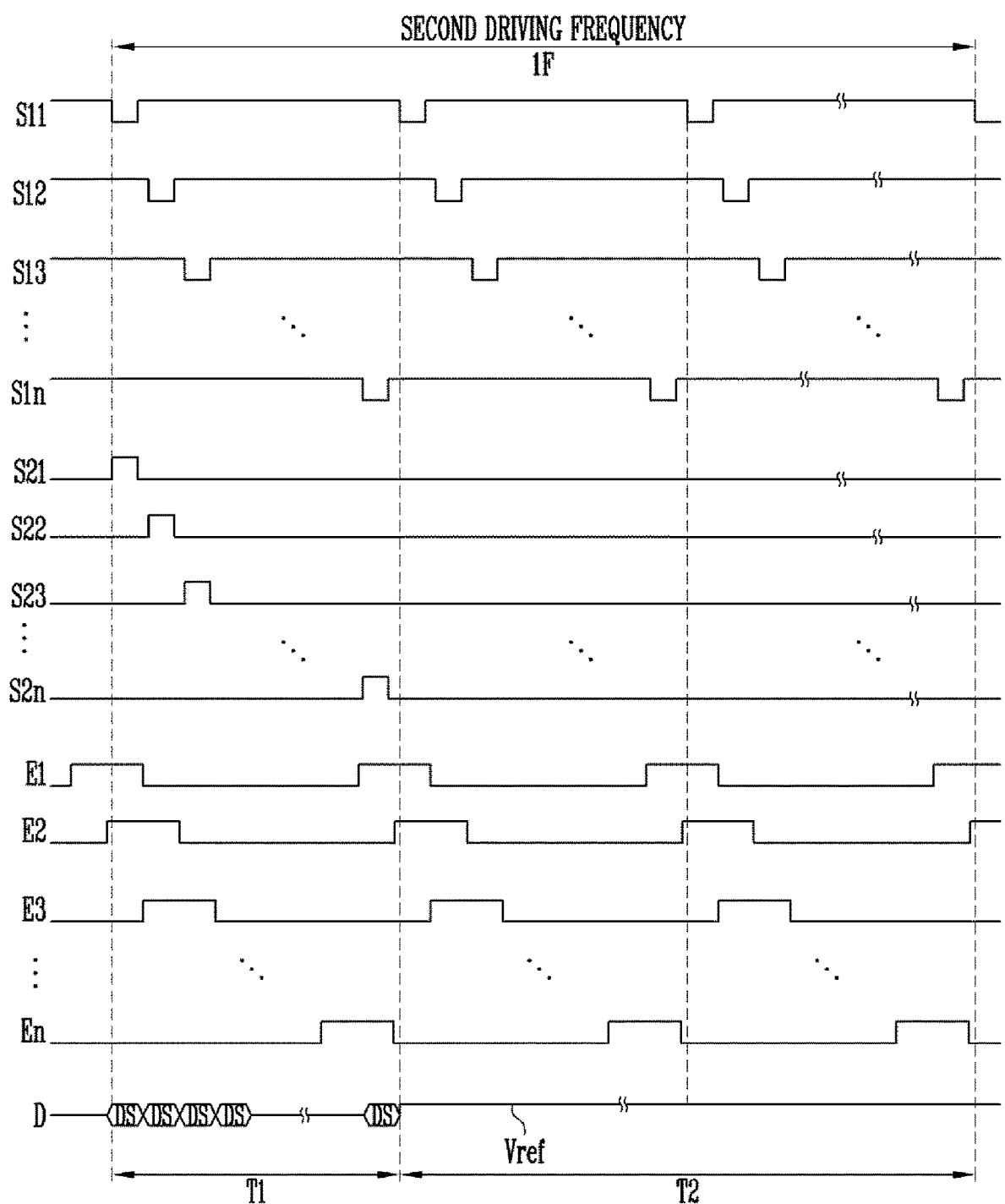
FIG. 12 is a waveform diagram illustrating an embodiment of a driving method when the pixel shown in FIG. 9 is driven at the second driving frequency.

FIG. 12 is a waveform diagram illustrating an embodiment of a driving method when the pixel shown in FIG. 9 is driven at the second driving frequency. The driving method of FIG. 12 is substantially identical to that of FIG. 6 except that only the polarity of scan signals supplied to the second scan lines S21 to S2n is changed; therefore, the driving method of FIG. 12 will be briefly described.

Referring to FIG. 12, scan signals are sequentially supplied to the first scan lines S11 to S1n and the second scan lines S21 to S2n during a first period T1 of one frame period 1F. In addition, emission control signals are sequentially supplied to the emission control lines E1 to En during the first period T1. Then, a voltage corresponding to a data signal DS is stored in each of the pixels PXL during the first period T1.

A plurality of scan signals are supplied to each of the first scan lines S11 to S1n during a second period T2 of the one frame period 1F. In an embodiment, a scan signal may be sequentially supplied several times to each of the first scan lines S11 to S1n during the second period T2.

A plurality of emission control signal are supplied to each of the emission control lies E1 to En during the second period T2. Here, an emission control signal supplied to an ith emission control line Ei may be supplied to overlap with scan signals supplied to an (i−1) the first scan line S1i−1 and an ith first scan line S1i. In addition, a voltage of a reference voltage Vref is supplied to the data lines D during the second period T2.

Here, when the plurality of scan signals are supplied to each of the first scan lines S11 to S1n during the second period T2, characteristics of the first transistor M1 included in each of the pixels PXL are periodically changed, and according, the display quality of the organic light emitting display device can be improved.

Figure 13:
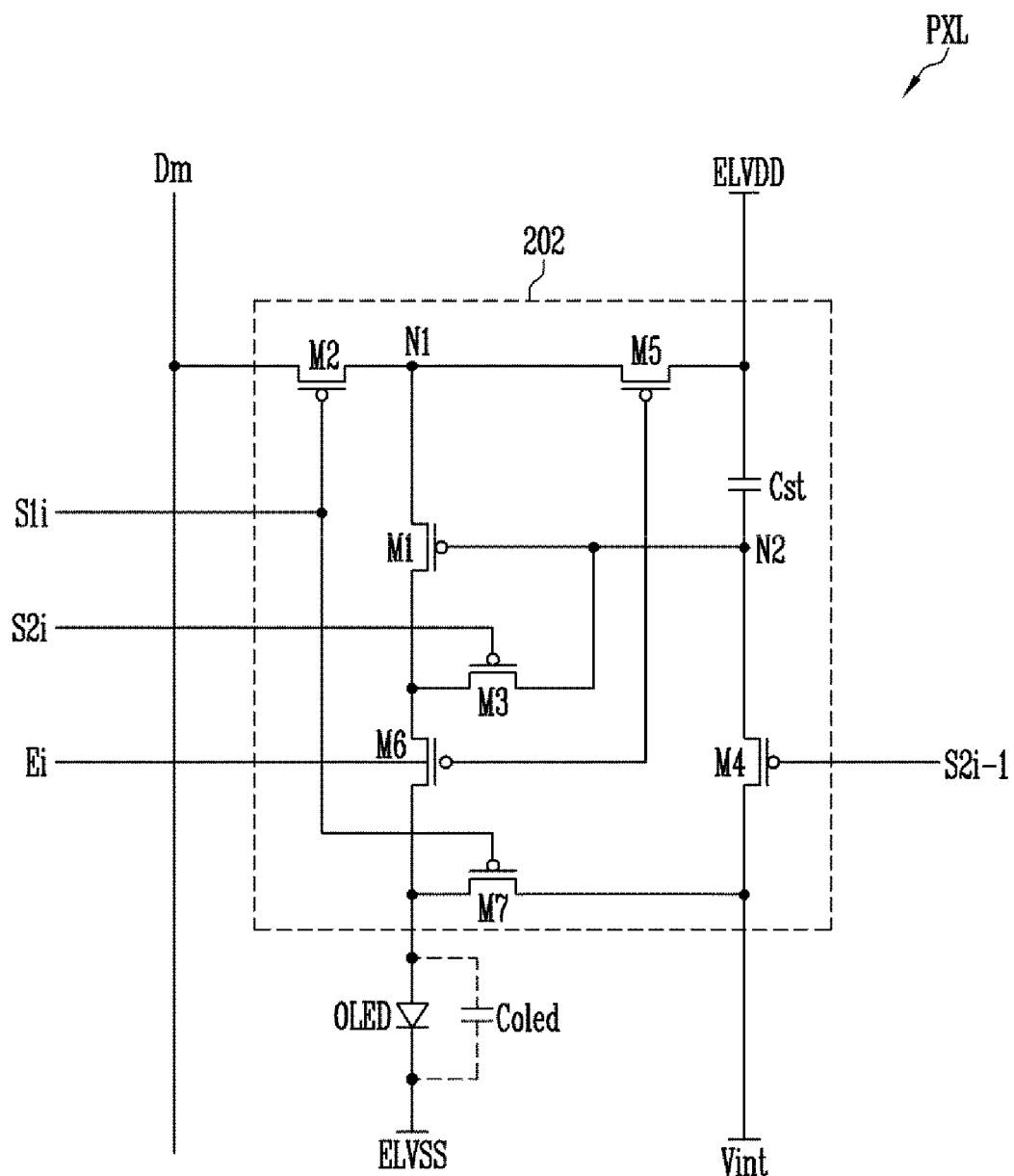
FIG. 13 is a circuit diagram illustrating still another embodiment of the pixel shown in FIG. 1.

FIG. 13 is a circuit diagram illustrating still another embodiment of the pixel shown in FIG. 1. In FIG. 13, components identical to those of FIG. 2 are designated by like reference numerals, and their detailed descriptions may not be repeated.

Referring to FIG. 13, the pixel according to the embodiment of the present disclosure includes an organic light emitting diode OLED and a pixel circuit 202 for controlling the amount of current supplied to the organic light emitting diode OLED.

An anode electrode of the organic light emitting diode OLED is coupled to the pixel circuit 202, and a cathode electrode of the organic light emitting diode OLED is coupled to the second driving power source ELVSS. The organic light emitting diode OLED generates light with a luminance (e.g., a predetermined luminance) corresponding to the amount of current supplied from the pixel circuit 202.

The pixel circuit 202 controls the amount of current flowing from the first driving power source ELVDD to the second driving power source ELVSS via the organic light emitting diode OLED, corresponding to a data signal. To this end, the pixel circuit 202 includes first to seventh transistors M1 to M7 and a storage capacitor Cst.

The sixth transistor M6 is coupled between a second electrode of the first transistor M1 and the anode electrode of the organic light emitting diode OLED. In addition, a gate electrode of the sixth transistor M6 is coupled to an emission control line Ei. The sixth transistor M6 is turned off when an emission control signal is supplied to the emission control line Ei, and is turned on otherwise.

The seventh transistor M7 is coupled between the anode electrode of the organic light emitting diode OLED and the initialization power source Vint. In addition, a gate electrode of the seventh transistor M7 is coupled to an ith first scan line S1i. The seventh transistor M7 is turned on when a scan signal is supplied to the ith first scan line S1i to supply the voltage of the initialization power source Vint to the anode electrode of the organic light emitting diode OLED.

If the voltage of the initialization power source Vint is supplied to the anode electrode of the organic light emitting diode OLED, a parasitic capacitor (hereinafter, referred to as an "organic capacitor Coled") of the organic light emitting diode OLED is discharged. When the organic capacitor Coled is discharged, the black expression ability of the pixel PXL is improved.

For example, a voltage (e.g., a predetermined voltage) is charged in the organic capacitor Coled, corresponding to a current supplied from the first transistor M1, during a previous frame period. When the organic capacitor Coled is charged, the organic light emitting diode OLED may easily emit light even at a low current.

A black data signal may be supplied in a current frame period. When the black data signal is supplied, the first transistor M1 is to ideally supply no current to the organic light emitting diode OLED. However, a leakage current (e.g., a predetermined leakage current) is supplied to the organic light emitting diode OLED even when the black data signal is supplied. At this time, when the organic capacitor Coled is in a charge-state, light is minutely emitted from the organic light emitting diode OLED, and therefore, the black expression ability of the pixel PXL is deteriorated.

On the other hand, in the present disclosure, when the organic capacitor Coled is discharged by the initialization power source Vint, the organic light emitting diode OLED is set to the non-emission state by leakage current. That is, in the present disclosure, the organic capacitor Coled is discharged using the initialization power source Vint, and accordingly, the black expression ability of the pixel PXL can be improved (e.g., the pixel may express deeper and darker blacks).

An operating process of the pixel PXL will be described in conjunction with FIGS. 13 and 3. First, an emission control signal is supplied to the emission control line Ei. When the emission control signal is supplied to the emission control line Ei, the fifth transistor M5 and the sixth transistor M6 are turned off. When the fifth transistor M5 is turned off, the electrical coupling between a first node N1 and the first driving power source ELVDD is interrupted. When the sixth transistor M6 is turned off, the electrical coupling between the first transistor M1 and the organic light emitting diode OLED is interrupted. Therefore, the pixel PXL is set to the non-emission state during a period in which the emission control signal is supplied to the emission control line Ei.

After that, a scan signal is supplied to an (i−1)th second scan line S2i−1. When the scan signal is supplied to the (i−1)th second scan line S2i−1, the fourth transistor M4 is turned on. When the fourth transistor M4 is turned on, the voltage of the initialization power source Vint is supplied to a second node N2.

After the voltage of the initialization power source Vint is supplied to the second node N2, scan signals are supplied to an ith first scan line S1i and an ith second scan line S2i. When the scan signal is supplied to the ith second scan line S2i, the third transistor M3 is turned on. When the third transistor M3 is turned on, the first transistor M1 is diode-coupled.

If the scan signal is supplied to the ith first scan line S1i, the second transistor M2 and the seventh transistor M7 are turned on. When the seventh transistor M7 is turned on, the voltage of the initialization power source Vint is supplied to the anode electrode of the organic light emitting diode OLED. When the second transistor M2 is turned on, a data signal DS from a data line Dm is supplied to the first node N1. At this time, because the second node N2 is initialized to the voltage of the initialization power source Vint, which is lower than the voltage of the data signal DS, the first transistor M1 is turned on.

If the first transistor M1 is turned on, the data signal DS supplied to the first node N1 is supplied to the second node N2 via the diode-coupled first transistor M1. Then, a voltage corresponding to the data signal DS and a threshold voltage of the first transistor M1 is applied to the second node N2. At this time, the storage capacitor Cst stores a voltage of the second node N2.

The supply of the emission control signal to the emission control line Ei is stopped after the voltage corresponding to the data signal DS and the threshold voltage of the first transistor M1 is stored in the storage capacitor Cst. When the supply of the emission control signal to the emission control line Ei is stopped, the fifth transistor M5 and the sixth transistor M6 are turned on.

When the fifth transistor M5 is turned on, the first driving power source ELVDD and the first node N1 are electrically coupled to each other. At this time, the first transistor M1 controls the amount of current flowing from the first driving power source ELVDD to the second driving power source ELVDD via the organic light emitting diode OLED, corresponding to the voltage of the second node N2. Then, the organic light emitting diode OLED generates light with a luminance corresponding to the amount of the current. Actually, the pixel PXL of the present disclosure is driven while repeating the above-described process.

The pixel shown in FIG. 13 is driven at the first driving frequency and the second driving frequency, corresponding to the driving waveforms of FIGS. 5 and 6. A driving method of the pixel PXL shown in FIG. 13 when the pixel PXL is driven at the first driving frequency and the second driving frequency is substantially identical to that of the pixel PXL shown in FIG. 2, and therefore, its detailed description may not be repeated.

The first to seventh transistors M1 to M7 are formed as P-type transistors. In an embodiment, the first to seventh transistors M1 to M7 may be formed as P-type poly-silicon semiconductor transistors.

Figure 14:
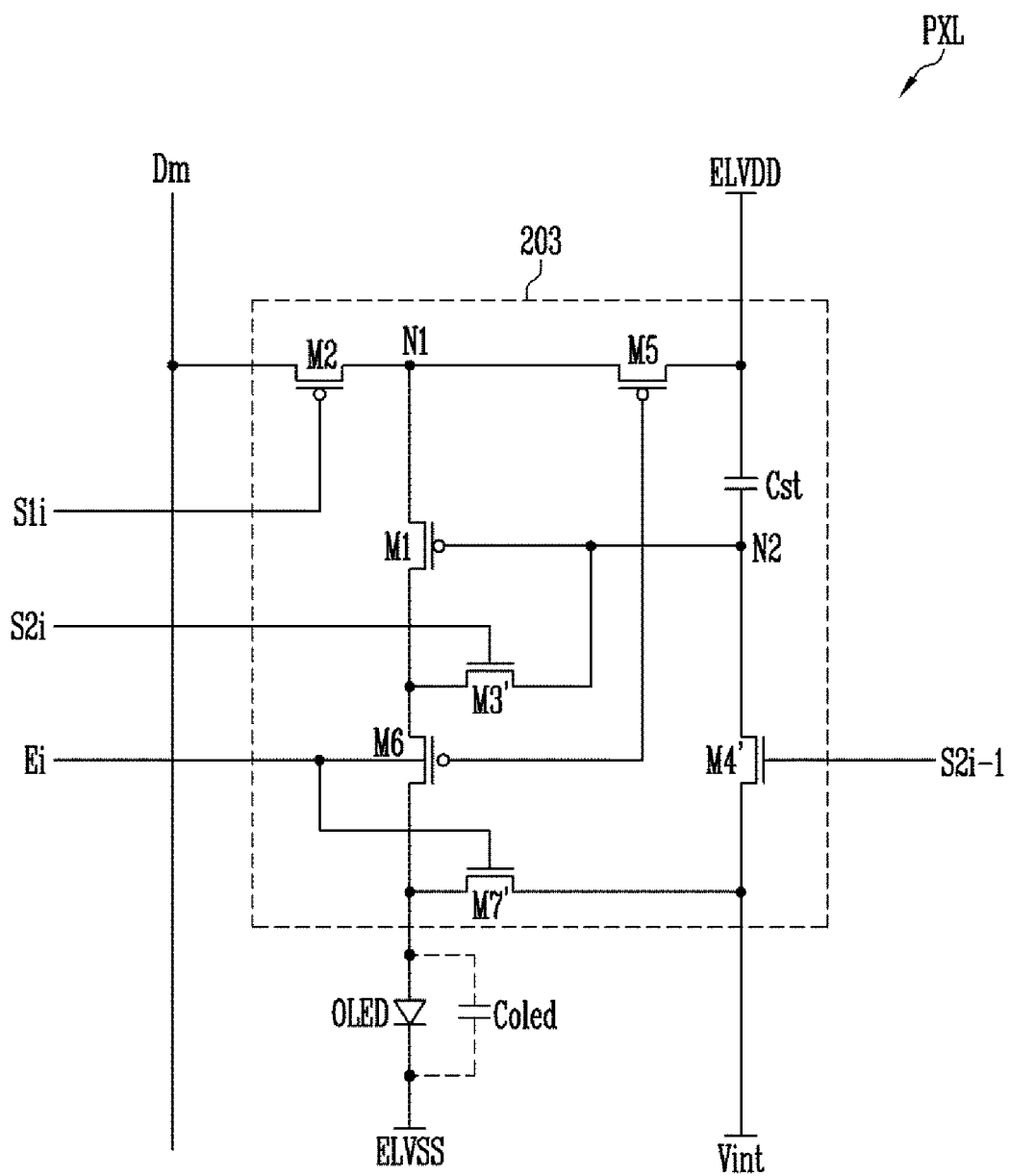
FIG. 14 is a circuit diagram illustrating still another embodiment of the pixel shown in FIG. 1.

FIG. 14 is a circuit diagram illustrating still another embodiment of the pixel shown in FIG. 1. In FIG. 14, components identical to those of FIG. 13 are designated by like reference numerals, and their detailed descriptions may not be repeated.

Referring to FIG. 14, the pixel PXL according to the embodiment of the present disclosure includes an organic light emitting diode OLED and a pixel circuit 203 for controlling the amount of current supplied to the organic light emitting diode OLED.

An anode electrode of the organic light emitting diode OLED is coupled to the pixel circuit 203, and a cathode electrode of the organic light emitting diode OLED is coupled to the second driving power source ELVSS. The organic light emitting diode OLED generates light with a luminance (e.g., a predetermined luminance) corresponding to the amount of current supplied from the pixel circuit 203.

The pixel circuit 203 controls the amount of current flowing from the first driving power source ELVDD to the second driving power source ELVDD via the organic light emitting diode OLED, corresponding to a data signal. To this end, the pixel circuit 203 includes a first transistor M1, a second transistor M2, a third transistor M3', a fourth transistor M4', a fifth transistor M5, a sixth transistor M6, a seventh transistor M7', and a storage capacitor Cst.

The third transistor M3' is coupled between a second node of the first transistor M1 and a second node N2. In addition, a gate electrode of the third transistor M3' is coupled to an ith second scan line S2i. The third transistor M3' is turned on when a scan signal is supplied to the ith second scan line S2i to allow the second electrode of the first transistor M1 and the second node N2 to be electrically coupled to each other. Therefore, when the third transistor M3' is turned on, the first transistor M1 is diode-coupled.

The fourth transistor M4' is coupled between the second node N2 and the initialization power source Vint. In addition, a gate electrode of the fourth transistor M4' is coupled to an (i−1)th second scan line S2i−1. The fourth transistor M4' is turned on when a scan signal is supplied to the (i−1)th second scan line S2i−1 to supply the voltage of the initialization power source Vint to the second node N2.

The seventh transistor M7' is coupled between the anode electrode of the organic light emitting diode OLED and the initialization power source Vint. In addition, a gate electrode of the seventh transistor M7' is coupled to an emission control line Ei. The seventh transistor M7' is turned on when an emission control signal is supplied to the emission control line Ei to supply the voltage of the initialization power source Vint to the anode electrode of the organic light emitting diode OLED.

The third transistor M3', the fourth transistor M4', and the seventh transistor M7' are formed as N-type transistors. In an embodiment, the third transistor M3', the fourth transistor M4', and the seventh transistor M7' may be formed as N-type oxide semiconductor transistors. When the third transistor M3' and the fourth transistor M4' are formed as oxide semiconductor transistors, leakage current from the second node N2 can be reduced or minimized. In addition, when the seventh transistor M7' is formed as an oxide semiconductor transistor, leakage current between the anode electrode of the organic light emitting diode OLED and the initialization power source Vint can be reduced or minimized.

An operating process of the pixel PXL shown in FIG. 14 is substantially similar or identical to that of the pixel PXL shown in FIG. 13 except that the third transistor M3', the fourth transistor M4', and the seventh transistor M7' are formed as N-type transistors. In other words, a driving method of the pixel PXL shown in FIG. 14 is similar or identical to that of the pixel PXL shown in FIG. 13 except that, as shown in FIG. 10, scan signals supplied to the second scan lines S are set to a high voltage (i.e., the gate-on voltage) such that the third transistor M3' and the fourth transistor M4', which are formed as N-type transistors, can be turned on. Therefore, a detailed description of said elements may not be repeated.

Figure 15:
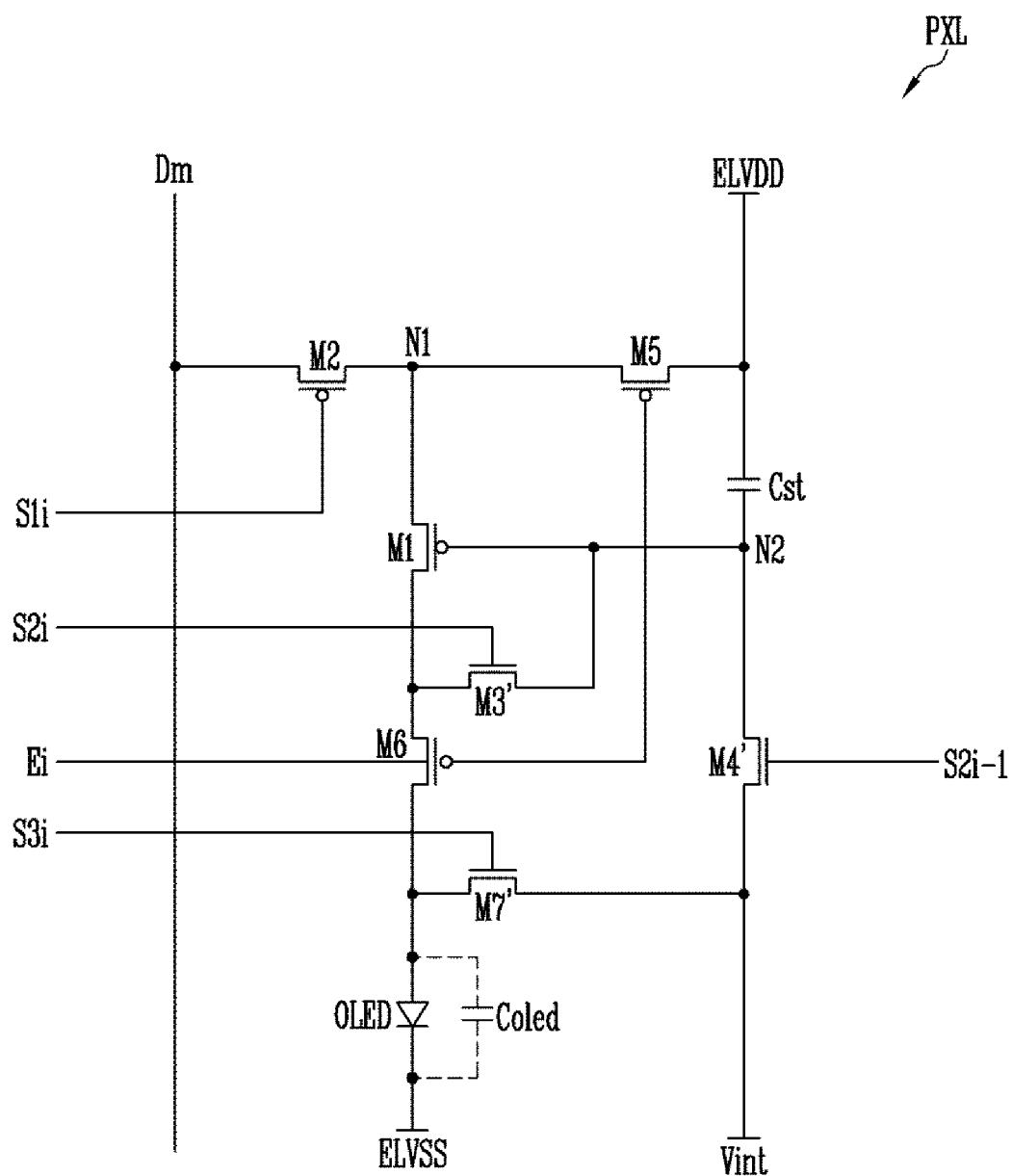
FIG. 15 is a circuit diagram illustrating still another embodiment of the pixel shown in FIG. 1.

In FIG. 14, it is illustrated that the seventh transistor M7' is couple to the emission control line Ei, but the embodiment of the present disclosure is not limited thereto. In an embodiment, the seventh transistor M7' may be coupled to an ith third scan line S3i additionally formed as shown in FIG. 15. In this case, a third scan driver for supplying scan signals to third scan lines S3 may be additionally provided to the organic light emitting display device.

Figure 16A:
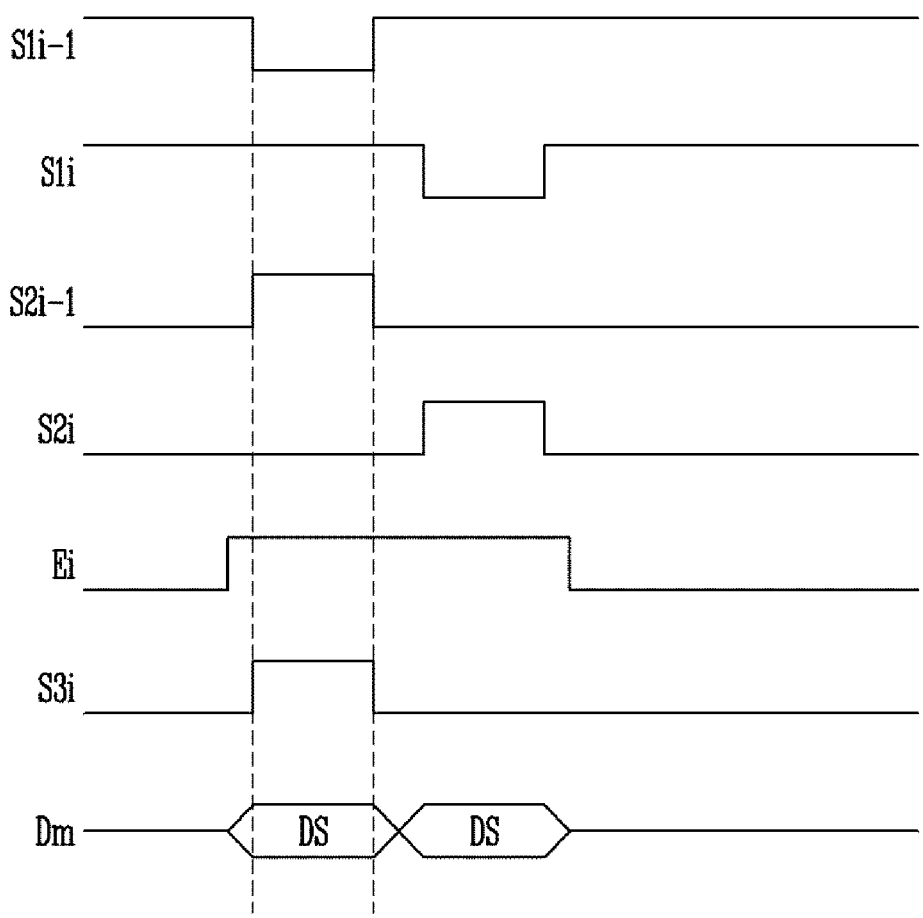
FIGS. 16A-16B are waveform diagrams illustrating an embodiment of a driving method of the pixel shown in FIG. 15.
Figure 16B:
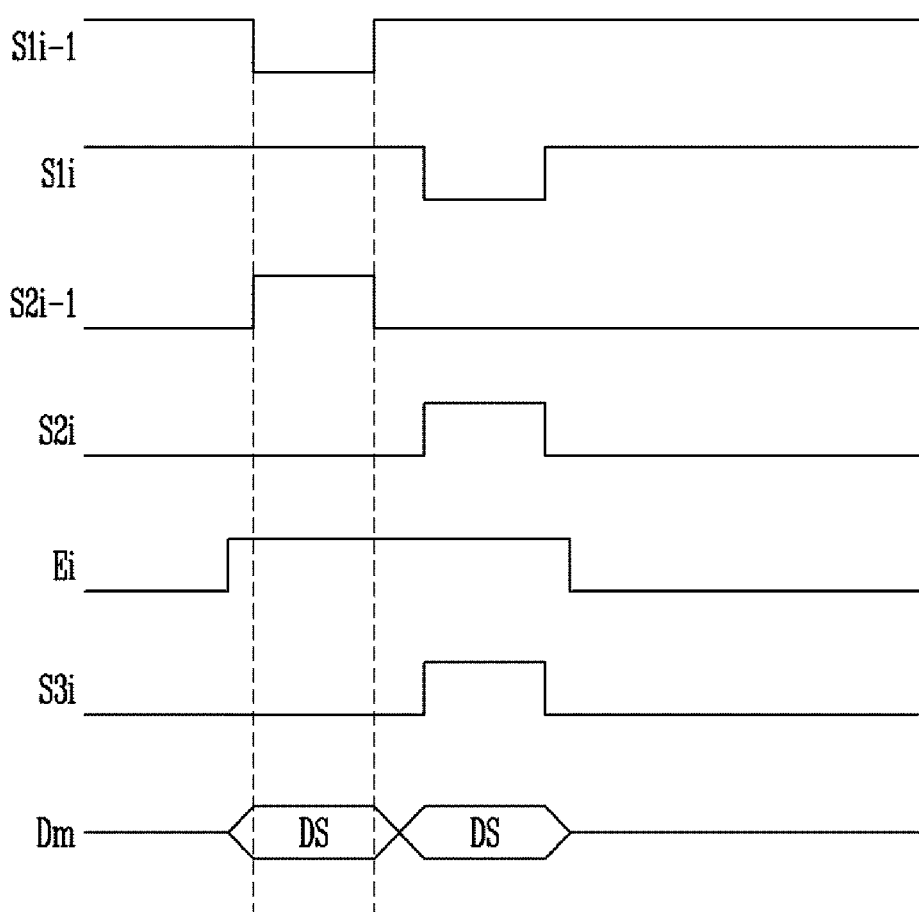

As shown in FIGS. 16A and 16B, a scan signal (gate-on voltage of a high level) is supplied to the ith third scan line S3i to overlap with the emission control signal supplied to the emission control line Ei. When the scan signal is supplied to the ith third scan line S3i, the seventh transistor M7' is turned on, so that the voltage of the initialization power source Vint is supplied to the anode electrode of the organic light emitting diode OLED.

Figure 17:
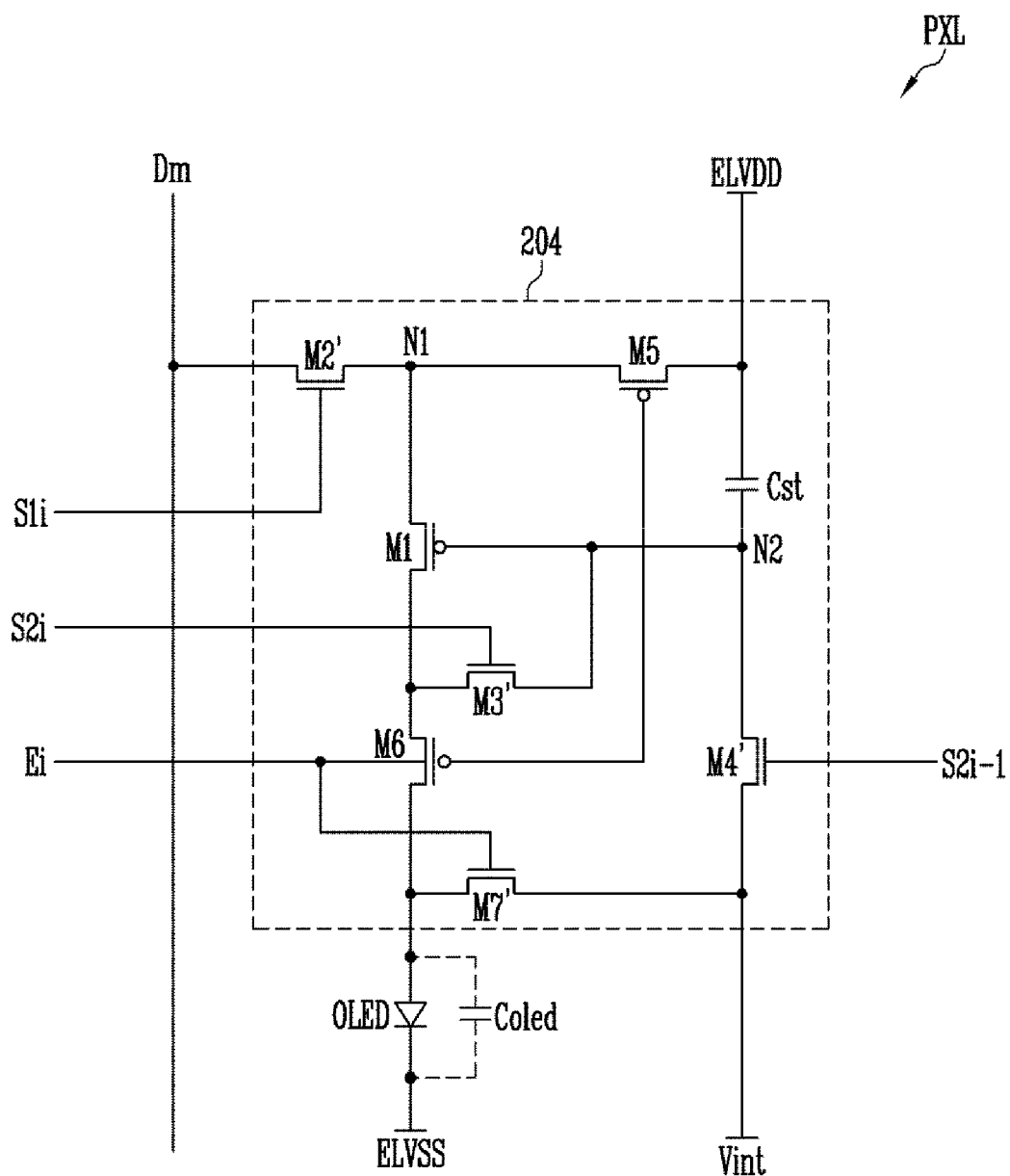
FIG. 17 is a circuit diagram illustrating still another embodiment of the pixel shown in FIG. 1.

FIG. 17 is a circuit diagram illustrating still another embodiment of the pixel shown in FIG. 1. In FIG. 17, components identical to those of FIG. 14 are designated by like reference numerals, and their detailed descriptions may not be repeated.

Referring to FIG. 17, the pixel PXL according to the embodiment of the present disclosure includes an organic light emitting diode OLED and a pixel circuit 204 for controlling the amount of current supplied to the organic light emitting diode OLED.

An anode electrode of the organic light emitting diode OLED is coupled to the pixel circuit 204, and a cathode electrode of the organic light emitting diode OLED is coupled to the second driving power source ELVSS. The organic light emitting diode OLED generates light with a luminance (e.g., a predetermined luminance) corresponding to the amount of current supplied from the pixel circuit 204.

The pixel circuit 204 controls the amount of current flowing from the first driving power source ELVDD to the second driving power source ELVSS via the organic light emitting diode OLED, corresponding to a data signal. To this end, the pixel circuit 204 includes a first transistor M1, a second transistor M2', a third transistor M3', a fourth transistor M4', a fifth transistor M5, a sixth transistor M6, a seventh transistor M7', and a storage capacitor Cst.

The second transistor M2' is coupled between a data line Dm and a first node N1. In addition, a gate electrode of the second transistor M2' is coupled to an ith first scan line S1i. The second transistor M2' is turned on when a scan signal is supplied to the ith first scan line S1i to allow the data line Dm and the first node N1 to be electrically coupled to each other.

The second transistor M2' may be formed as an N-type oxide semiconductor transistor. When the second transistor M2' may be formed as an N-type oxide semiconductor transistor, leakage current between the data line Dm and the first node N1 can be reduced or minimized, and accordingly, the display quality of the organic light emitting display device can be improved.

Figure 18:
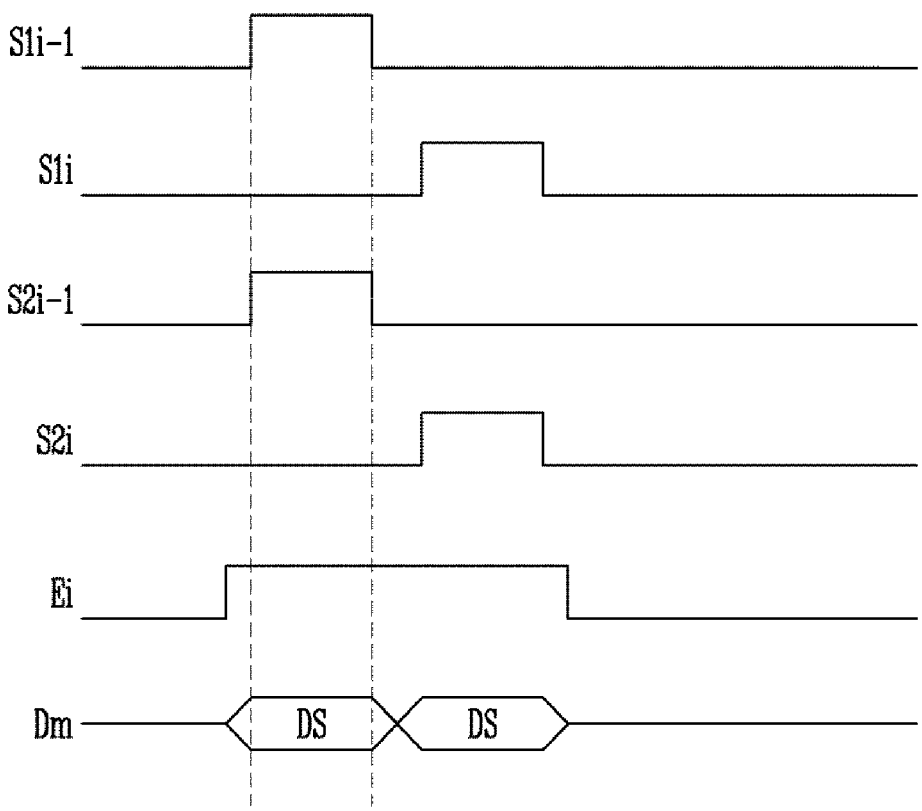
FIG. 18 is a waveform diagram illustrating an embodiment of a driving method of the pixel shown in FIG. 17.

Additionally, an operating process of the pixel PXL shown in FIG. 17 is substantially similar or identical to that of the pixel PXL shown in FIG. 14 except that the second transistor M2' is formed as an N-type transistor. In other words, a driving method of the pixel PXL shown in FIG. 17 is similar or identical to that of the pixel PXL shown in FIG. 14 except that, as shown in FIG. 18, scan signals supplied to the second scan lines S are set to a high voltage (i.e., the gate-on voltage) such that the second transistor M2' formed as an N-type transistor can be turned on. Therefore, a detailed description of said elements may not be repeated.

Figure 19:
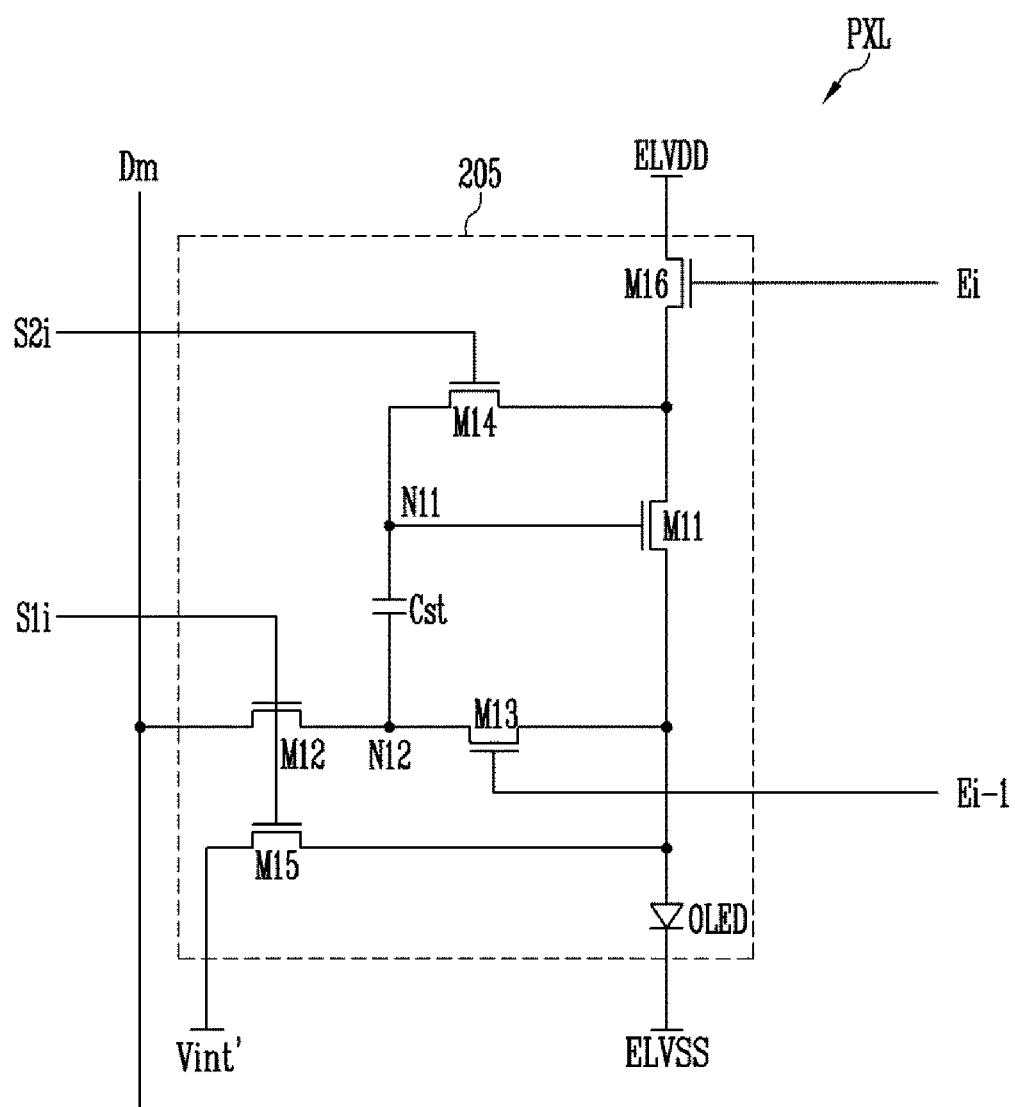
FIG. 19 is a circuit diagram illustrating still another embodiment of the pixel shown in FIG. 1.

FIG. 19 is a circuit diagram illustrating still another embodiment of the pixel shown in FIG. 1. For convenience of description, a pixel that is located on an ith horizontal line and is coupled to an mth data line Dm is illustrated in FIG. 19.

Referring to FIG. 19, the pixel PXL according to the embodiment of the present disclosure includes an organic light emitting diode OLED and a pixel circuit 205 for controlling the amount of current supplied to the organic light emitting diode OLED.

An anode electrode of the organic light emitting diode OLED is coupled to the pixel circuit 205, and a cathode electrode of the organic light emitting diode OLED is coupled to the second driving power source ELVSS. The organic light emitting diode OLED generates light with a luminance (e.g., a predetermined luminance) corresponding to the amount of current supplied from the pixel circuit 205.

The pixel circuit 205 controls the amount of current flowing from the first driving power source ELVDD to the second driving power source ELVSS via the organic light emitting diode OLED, corresponding to a data signal. To this end, the pixel circuit 205 includes eleventh to sixteenth transistors M11 to M16 and a storage capacitor Cst.

A first electrode of the eleventh transistor (or driving transistor) M11 is coupled to the first driving power source ELVDD via the sixteenth transistor M16, and a second electrode of the eleventh transistor M11 is coupled to the anode electrode of the organic light emitting diode OLED. In addition, a gate electrode of the eleventh transistor M11 is coupled to an eleventh node N11. The eleventh transistor M11 controls the amount of the current flowing from the first driving power source ELVDD to the second driving power source ELVSS via the organic light emitting diode OLED, corresponding to a voltage of the eleventh node N11.

The twelfth transistor M12 is coupled between a data line Dm and a twelfth node N12. In addition, a gate electrode of the twelfth transistor M12 is coupled to an ith first scan line S1i. The twelfth transistor M12 is turned on when a scan signal is supplied to the ith first scan line S1i. To this end, the scan signal is set to the gate-on voltage.

The thirteenth transistor M13 is coupled between the twelfth node N12 and the anode electrode of the organic light emitting diode OLED. In addition, a gate electrode of the thirteenth transistor M13 is coupled to an (i−1)th emission control line Ei−1. The thirteenth transistor M13 is turned off when an emission control signal is supplied to the (i−1)th emission control line Ei−1, and is turned on when the emission control signal is not supplied. To this end, the emission control signal is set to the gate-off voltage.

The fourteenth transistor M14 is coupled between the eleventh node N11 and the first electrode of the eleventh transistor M11. In addition, a gate electrode of the fourteenth transistor M14 is coupled to an ith second scan line S2i. The fourteenth transistor M14 is turned on when a scan signal is supplied to the ith second scan line S2i.

The fifteenth transistor M15 is coupled between an initialization power source Vint' and the anode electrode of the organic light emitting diode OLED. In addition, a gate electrode of the fifteenth transistor M15 is coupled to the ith first scan line S1i. The fifteenth transistor M15 is turned on when the scan signal is supplied to the ith first scan line S1i.

In addition, a voltage of the initialization power source Vint' is set such that organic light emitting diode OLED is turned off.

The sixteenth transistor M16 is coupled between the first driving power source ELVDD and the first electrode of the eleventh transistor M11. In addition, a gate electrode of the sixteenth transistor M16 is coupled to an ith emission control line Ei. The sixteenth transistor M16 is turned off when an emission control signal is supplied to the ith emission control line, and is turned on when the emission control signal is not supplied.

The storage capacitor Cst is coupled between the eleventh node N11 and the twelfth node N12 that is a common node between the twelfth transistor M12 and the thirteenth transistor M13. The storage capacitor Cst stores a voltage corresponding to the data signal and a threshold voltage of the eleventh transistor M11.

The eleventh to sixteenth transistors M11 to M16 are formed as N-type transistors. In an embodiment, the eleventh to sixteenth transistors M11 to M16 may be formed as N-type poly-silicon semiconductor transistors or N-type oxide semiconductor transistors.

Figure 20:
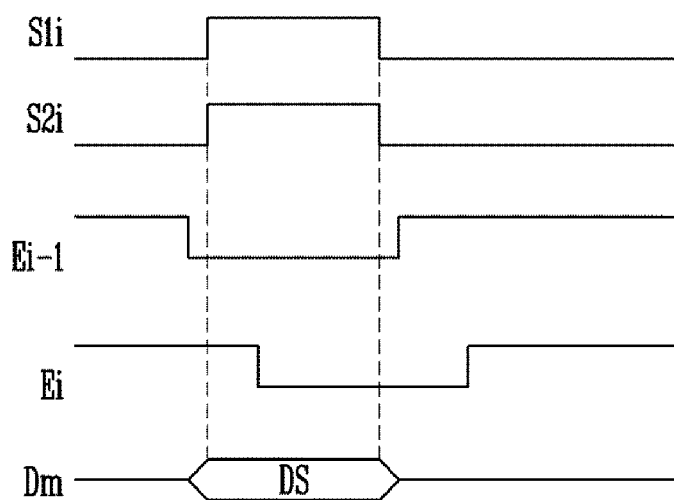
FIG. 20 is a waveform diagram illustrating an embodiment of a driving method of the pixel shown in FIG. 19.

FIG. 20 is a waveform diagram illustrating an embodiment of a driving method of the pixel shown in FIG. 19.

Referring to FIG. 20, first, an emission control signal is supplied to the (i−1)th emission control line Ei−1. When the emission control signal is supplied to the (i−1)th emission control line Ei−1, the thirteenth transistor M13 is turned off. When the thirteenth transistor M13 is turned off, the electrical coupling between the twelfth node N12 and the anode electrode of the organic light emitting diode OLED is interrupted.

After that, scan signals are supplied to the ith first scan line S1i and the ith second scan line S2i. When the scan signal is supplied to the ith first scan line S1i, the twelfth transistor M12 and the fifteenth transistor M15 are turned on. In addition, when the scan signal is supplied to the ith second scan line S2i, the fourteenth transistor M14 is turned on.

When the twelfth transistor M12 is turned on, the data line Dm and the twelfth node N12 are electrically coupled to each other. Then, a data signal DS from the data line Dm is supplied to the twelfth node N12.

When the fourteenth transistor M14 is turned on, the eleventh node N11 and the first electrode of the eleventh transistor M11 are electrically coupled to each other. At this time, the eleventh node N11 is initialized to a voltage of the first driving power source ELVDD. In addition, when the fourteenth transistor M14 is turned on, the eleventh transistor M11 is diode-coupled.

When the fifteenth transistor M15 is turned on, a voltage of the initialization power source Vint' is supplied to the anode electrode of the organic light emitting diode OLED, and accordingly, the anode electrode of the organic light emitting diode OLED is initialized to the voltage of the initialization power source Vint'. At this time, the organic light emitting diode OLED is set to the non-emission state.

After that, an emission control signal is supplied to the ith emission control line Ei. When the emission control signal is supplied to the ith emission control line Ei, the sixteenth transistor M16 is turned off. When the sixteenth transistor M16 is turned off, the electrical coupling between the first driving power source ELVDD and the first electrode of the eleventh transistor M11 is interrupted.

At this time, because the second electrode of the eleventh transistor M11 is set to the voltage of the initialization power source Vint', the eleventh node N11 is set to a voltage obtained by adding a threshold voltage of the eleventh transistor M11 to the voltage of the initialization power source Vint'. Here, because the twelfth node N12 is set to a voltage of the data signal DS, a voltage corresponding to the data signal DS and the threshold voltage of the eleventh transistor M11 is stored in the storage capacitor Cst.

After the voltage corresponding to the data signal DS and the threshold voltage of the eleventh transistor M11 is stored in the storage capacitor Cst, the supply of the emission control signal to the (i−1)th emission control line Ei−1 and the supply of the emission control signal to the ith emission control line Ei are sequentially stopped.

When the supply of the emission control signal to the (i−1)th emission control line Ei−1 is stopped, the thirteenth transistor M13 is turned on. When the thirteenth transistor M13 is turned on, the twelfth node N12 and the anode electrode of the organic light emitting diode OLED are electrically coupled to each other.

When the supply of the emission control signal to the ith emission control line Ei is stopped, the sixteenth transistor M16 is turned on. When the sixteenth transistor M16 is turned on, the voltage of the first driving power source ELVDD is supplied to the first electrode of the eleventh transistor M11. At this time, the eleventh transistor M11 controls the amount of current flowing from the first driving power source ELVDD to the second driving power source ELVSS via the organic light emitting diode OLED, corresponding to a voltage of the eleventh node N11. Actually, the pixel PXL shown in FIG. 19 is driven while repeating the above-described process.

Figure 21:
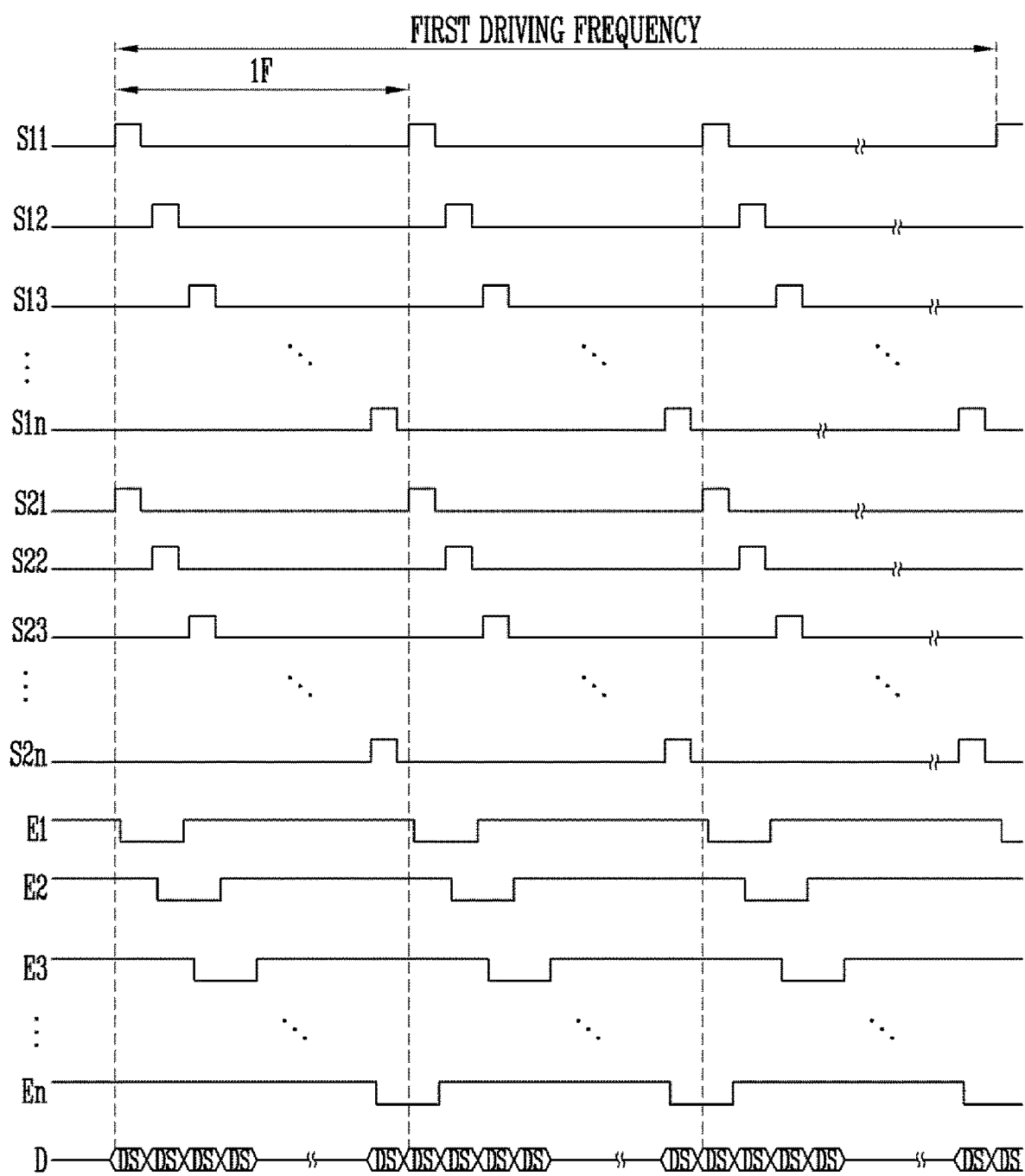
FIG. 21 is a waveform diagram illustrating an embodiment of a driving method when the pixel shown in FIG. 19 is driven at the first driving frequency.

FIG. 21 is a waveform diagram illustrating an embodiment of a driving method when the pixel shown in FIG. 19 is driven at the first driving frequency.

Referring to FIG. 21, when the organic light emitting display device is driven at the first driving frequency, scan signals are sequentially supplied to the first scan lines S11 to S1n and the second scan lines S21 to S2n during one frame period 1F. Here, a scan signal supplied to an ith first scan line S1i overlaps with that supplied to an ith second scan line S2i.

In addition, when the organic light emitting display device is driven at the first driving frequency, emission control signals are sequentially supplied to the emission control lines E1 to En during the one frame period 1F. Here, an emission control signal supplied to an ith emission control line Ei is supplied to overlap with the scan signal supplied to the ith first scan line S1i during a partial period and overlap with a scan signal supplied to an (i+1)th first scan line S1i+1. A data signal DS is supplied to the data lines Dm to be synchronized with the scan signals.

Then, as described in FIGS. 19 and 20, each of the pixels PXL generates light with a luminance (e.g., a predetermined luminance) corresponding to the data signal DS.

Figure 22:
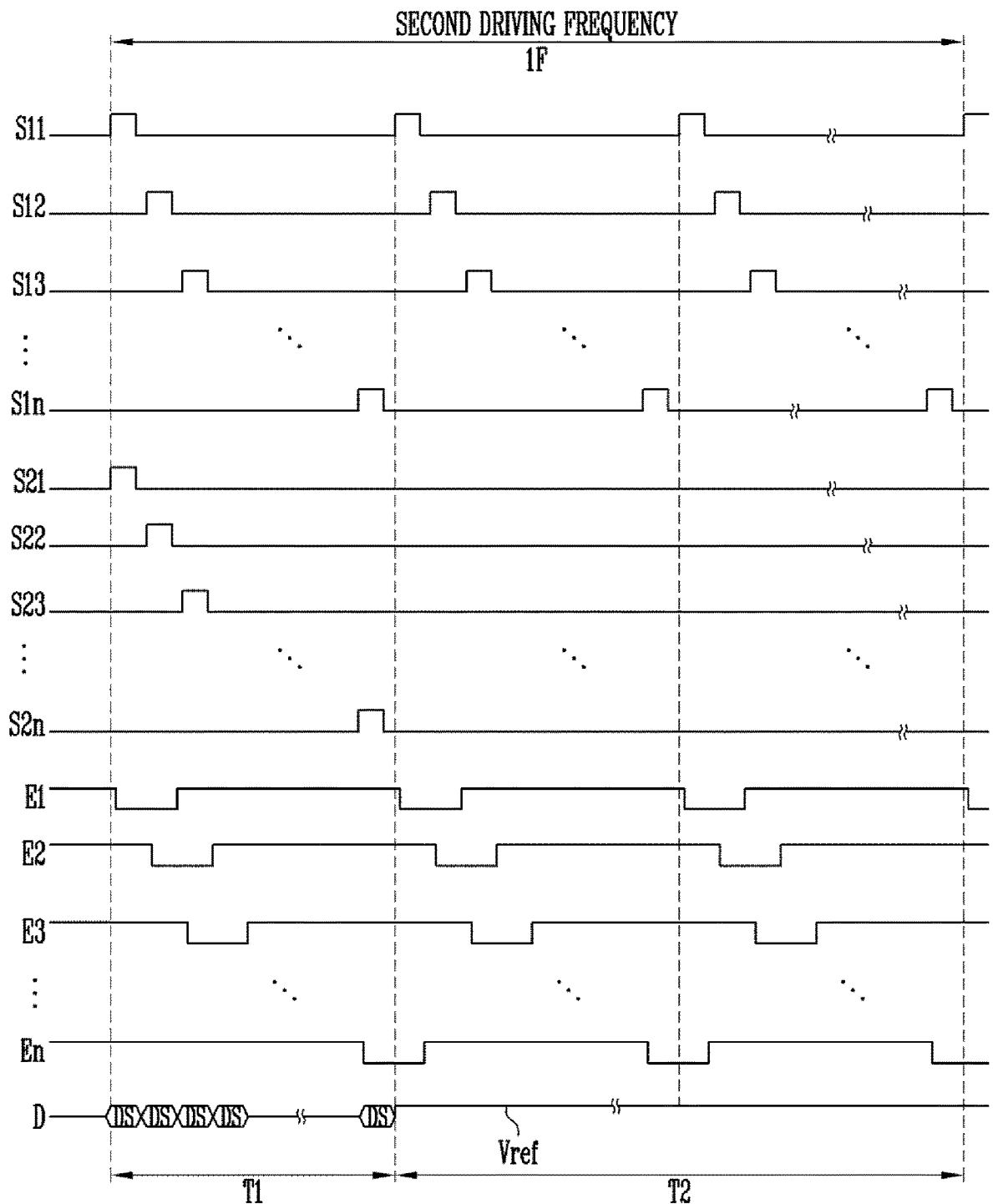
FIG. 22 is a waveform diagram illustrating an embodiment of a driving method when the pixel shown in FIG. 19 is driven at the second driving frequency.

FIG. 22 is a waveform diagram illustrating an embodiment of a driving method when the pixel shown in FIG. 19 is driven at the second driving frequency.

Referring to FIG. 22, when the organic light emitting display device is driven at the second driving frequency, one frame period 1F is divided in a first period T1 and a second period T2. Here, the second period T2 may be set as a period wider than the first period T1.

During the first period T1, scan signals are sequentially supplied to the first scan lines S11 to S1n and the second scan lines S21 to S2n. Here, a scan signal supplied to the ith first scan line S1i overlaps with the ith second scan line S2i.

In addition, during the first period T1, emission control signals are sequentially supplied to the emission control lines E1 to En. Here, an emission control signal supplied to the ith emission control line Ei is supplied to overlap with the scan signal supplied to the ith first scan line S1$i$ during a partial period and overlap with a scan signal supplied to the (i+1)th first scan line S1$i$+1. A data signal DS is supplied to the data lines D to be synchronized to the scan signals. Then, a voltage corresponding to the data signal DS is stored in each of the pixels PXL during the first period T1, and accordingly, each of the pixels PXL generates light with a corresponding luminance (e.g., a predetermined luminance).

During the second period T2, a plurality of scan signals are supplied to each of the first scan lines S11 to S1$n$. Here, the scan signals supplied to each of the first scan lines S11 to S1$n$ may be supplied for every set or predetermined period. In an embodiment, during the second period T2, scan signals may be supplied several times to the first scan lines S11 to S1$n$ while being sequentially repeated.

During the second period T2, a plurality of emission control signals are supplied to each of the emission control lines E1 to En. Here, an emission control signal supplied to the ith emission control line Ei is supplied to overlap with the scan signal supplied to the ith first scan line S1$i$ during a partial period and overlap with the scan signal supplied to the (i+1)th first scan line S1$i$+1. In addition, a voltage of a reference power source Vref is supplied to the data lines D during the second period T2.

The driving method will be described in conjunction with FIGS. 19 and 22. During the first period T1, a voltage of the data signal DS is stored in each of the pixels PXL. Then, the eleventh transistor M11 supplies, to the organic light emitting diode OLED, a current (e.g., a predetermined current) corresponding to a difference between a voltage of the data signal, applied to the eleventh node N11, and a voltage of the first driving power source ELVDD, applied to the first electrode thereof.

During a partial period of the second period T2, emission control signals are supplied to the (i−1)th emission control line (Ei−1) and the ith emission control line Ei, and accordingly, the thirteenth transistor M13 and the sixteenth transistor M16 are turned off. Then, the pixel PXL is set to the non-emission state.

After that, a scan signal is supplied to the ith first scan line S1$i$. When the scan signal is supplied to the ith first scan line S1$i$, the twelfth transistor M12 and the fifteenth transistor M15 are turned on. When the fifteenth transistor M15 is turned on, the anode electrode of the organic light emitting diode OLED is initialized to a voltage of the initialization power source Vint'.

When the twelfth transistor M12 is turned on, the voltage of the reference power source Vref is supplied to the twelfth node N12. When the voltage of the reference power source Vref is supplied to the twelfth node N12, a voltage of the eleventh node N11 is changed by coupling of the storage capacitor Cst. At this time, characteristic curves of the eleventh transistor M11 are changed corresponding to a difference between the voltage applied to the eleventh node N11 and the voltage of the first driving power source ELVDD. That is, in the embodiment of the present disclosure, it is possible to prevent characteristics of the eleventh transistor M11 from being fixed to a specific state, and accordingly, the display quality of the organic light emitting display device can be improved.

To this end, the voltage of the reference power source Vref may be set to a specific voltage within a voltage range of the data signal. In addition, the voltage of the reference power source Vref may be set to a voltage different from that of the first driving power source ELVDD.

When scan signals are sequentially supplied to the first scan lines S11 to S1$n$ and emission control signals are sequentially supplied to the emission control lines E1 to En during the period in which the organic light emitting display device is driven at the second driving frequency, a driving condition in which the organic light emitting display device is driven at the second driving frequency may be similar or identical to that in which the organic light emitting display device is driven at the first driving frequency. Accordingly, the display quality of the organic light emitting display device can be improved.

For example, when the first driving frequency is set to 60 Hz, the pixels PXL are set to the non-emission state sixty times in one second. In addition, when the second driving frequency is set to 10 Hz, the pixels PXL are set to the non-emission state ten times in one second. When numbers of times of the pixels PXL set to the non-emission state are differently set when the organic light emitting display device is driven at the first driving frequency and the second driving frequency, a luminance difference, and/or the like may be recognized by an observer even when the same image is displayed.

On the other hand, when an emission control signal is supplied five times to each of the emission control lines E1 to En during the second period T2 when the organic light emitting display device is driven at the second driving frequency (e.g., 10 Hz), a number of times of the pixels set to the non-emission state is set identically to a number of times of the pixels set to the non-emission state when the organic light emitting display device is driven at the first driving frequency. That is, in the embodiment of the present disclosure, the driving condition in which the organic light emitting display device is driven at the second driving frequency is similar or identical to the driving condition in which the organic light emitting display device is driven at the first driving frequency, so that the display quality of the organic light emitting display device can be improved. In addition, when the organic light emitting display device is driven at the second driving frequency, the data signal DS is supplied to the data lines D during (e.g., only during) the first period T1, and accordingly, the power consumption of the organic light emitting display device can be reduced or minimized.

Figure 23:
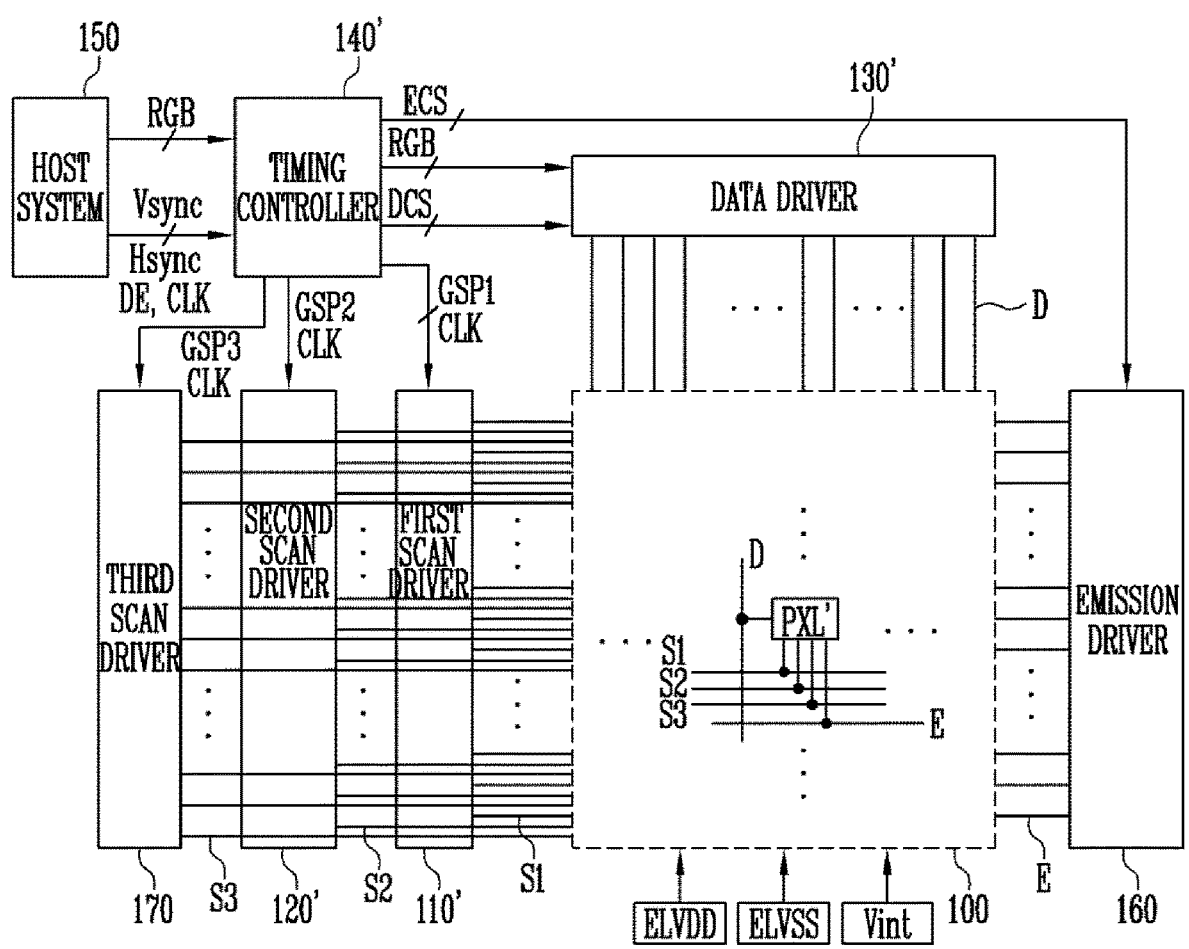
FIG. 23 is a diagram schematically illustrating an organic light emitting display device according to another embodiment of the present disclosure.

FIG. 23 is a diagram schematically illustrating an organic light emitting display device according to another embodiment of the present disclosure. In FIG. 23, components identical to those of FIG. 1 are designated by like reference numerals, and their detailed descriptions may not be repeated.

Referring to FIG. 23, the organic light emitting display device according to the embodiment of the present disclosure includes a pixel unit 100, a first scan driver 110', a second scan driver 120', a third scan driver 170, a data driver 130', a timing controller 140', a host system 150, and an emission driver 160.

The timing controller 140' supplies a gate start pulse GSP1, GSP2, or GSP3 and clock signals CLK to the first scan driver 110', the second scan driver 120', and the third scan driver 170, based on timing signals Vsync, Hsync, DE, and CLK.

A first gate start pulse GSP1 controls a first timing of a scan signal supplied from the first scan driver 110'. Clock signals CLK are used to shift (e.g., shift in time) the first gate start pulse GSP1.

A second gate start pulse GSP2 controls a first timing of a scan signal supplied from the second scan driver 120'.

Clock signals CLK are used to shift (e.g., shift in time) the second gate start pulse GSP2.

A third gate start pulse GSP3 controls a first timing of a scan signal supplied from the third scan driver 170. Clock signals CLK are used to shift (e.g., shift in time) the third gate start pulse GSP3.

The data driver 130' supplies a data signal to data lines D, corresponding to a data driving control signal DCS. The data signal supplied to the data lines D is supplied to pixels PXL' selected by a scan signal.

When the organic light emitting display device is driven at a first driving frequency, the data driver 130' supplies a data signal to the data lines D during one frame period. In this case, the data signal supplied to the data lines D may be supplied to be synchronized with scan signals supplied to first scan lines S1 and second scan lines S2.

When the organic light emitting display device is driven at a second driving frequency lower than the first driving frequency, the data driver 130' supplies a data signal to the data lines D during a first period T1 in one frame period, and supplies no data signal to the data lines D during a second period T2 except the first period T1.

Additionally, the first period refers to a period in which scan signals are supplied to the first scan lines S1 and the second scan lines S2. In addition, the second period refers to a period in which scan signals are supplied to third scan lines S3.

The first scan driver 110' supplies scan signals to the first scan lines S1, corresponding to the first gate start pulse GSP1. In an embodiment, the first scan driver 110' may sequentially supply the scan signals to the first scan lines S1. Here, the first scan driver 110' supplies scan signals to the first scan lines S1 during the period in which the organic light emitting display device is driven at the first driving frequency and the first period T1 when the organic light emitting display device is driven at the second driving frequency.

The second scan driver 120' supplies scan signals to the second scan lines S2, corresponding to the second gate start pulse GSP2. In an embodiment, the second scan driver 120' may sequentially supply the scan signals to the second scan lines S2. Here, the second scan driver 120' supplies scan signals to the second scan lines S2 during the period in which the organic light emitting display device is driven at the first driving frequency and the first period T1 when the organic light emitting display device is driven at the second driving frequency.

Additionally, when transistors coupled to the first scan lines S1 and the second scan lines S2 are formed of the same conductivity type (e.g., a P-type or N-type), the first scan driver 110' and the second scan driver 120' may be formed as one driver. This will be described in further detail later.

The third scan driver 170 supplies scan signals to the third scan lines S3, corresponding to the third gate start pulse GSP3. In an embodiment, the third scan driver 170 may sequentially supply the scan signals to the third scan lines S3. Here, the third scan driver 170 supplies scan signals to the third scan lines S3 during the second period T2 when the organic light emitting display device is driven at the second driving frequency.

The pixel unit 100 includes pixels PXL' located to be coupled to the data lines D, the scan lines S1, S2, and S3, and the emission control lines E. The pixels PXL' receives a first driving power source ELVDD, a second driving power source ELVSS, and an initialization power source Vint, which are supplied from the outside.

Each of the pixels PXL' is selected when scan signals are supplied to scan lines S1, S2, and S3 coupled thereto to receive a data signal from a data line D. The pixel PXL' receiving the data signal controls the amount of current flowing from the first driving power source ELVDD to the second driving power source ELVSS via an organic light emitting diode, corresponding to the data signal.

Additionally, each of the pixels PXL' may be coupled to one or more first scan lines S1, one or more second scan lines S2, one or more third scan lines S3, and one or more emission control lines E, corresponding to circuit structures thereof. That is, in the embodiment of the present disclosure, signal lines S1, S2, S3, E, and D coupled to the pixel PXL' may be variously set corresponding to circuit structures of the pixel PXL'.

Figure 24:
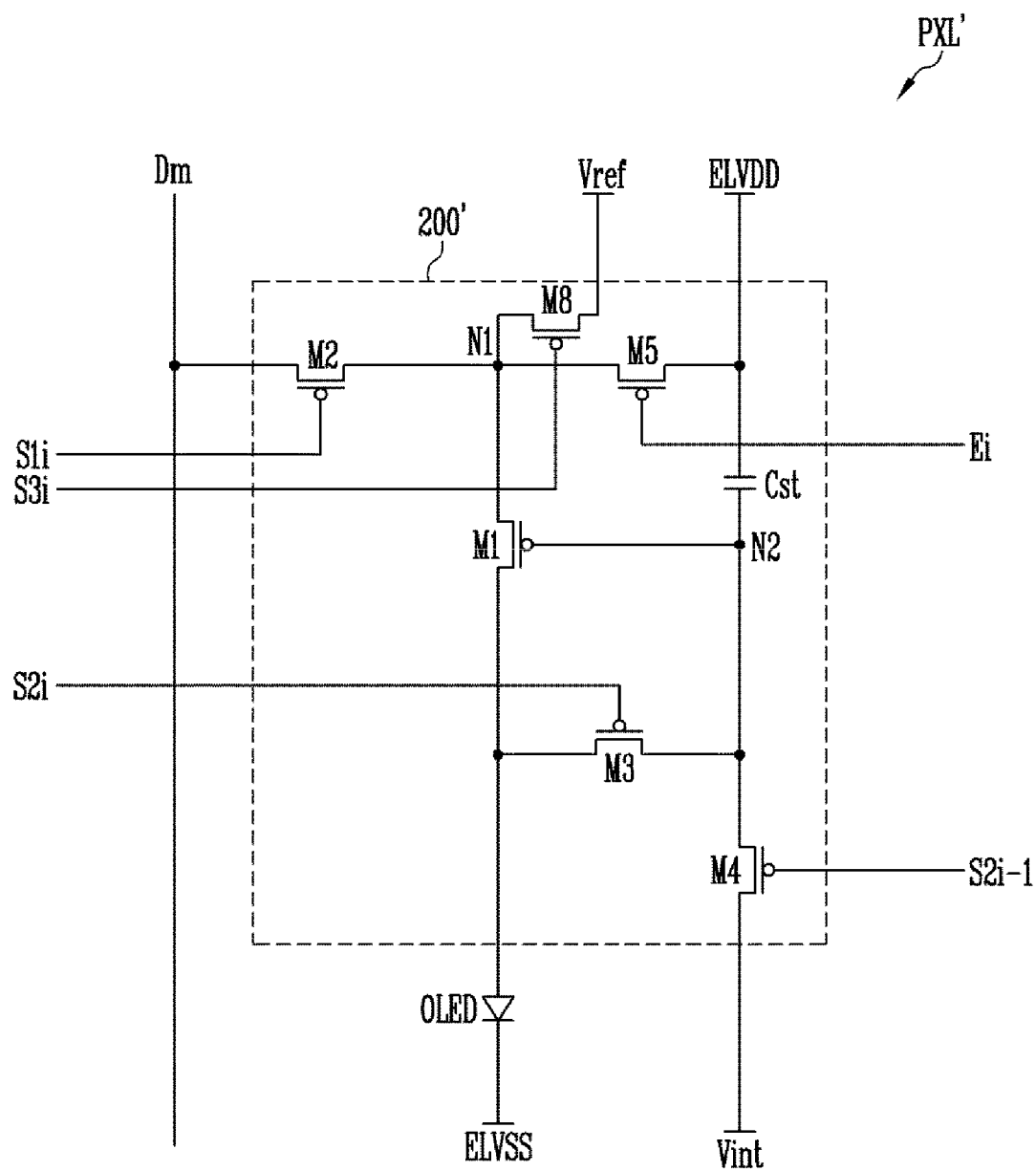
FIG. 24 is a circuit diagram illustrating an embodiment of a pixel shown in FIG. 23.

FIG. 24 is a circuit diagram illustrating an embodiment of the pixel shown in FIG. 23. For convenience of description, a pixel that is located on an ith horizontal line and is coupled to an mth data line Dm is illustrated in FIG. 24. In FIG. 24, components identical to those of FIG. 2 are designated by like reference numerals, and their detailed descriptions may not be repeated.

Referring to FIG. 24, the pixel PXL' according to the embodiment of the present disclosure includes an organic light emitting diode OLED and a pixel circuit 200' for controlling the amount of current supplied to the organic light emitting diode OLED.

An anode electrode of the organic light emitting diode OLED is coupled to the pixel circuit 200', and a cathode electrode of the organic light emitting diode OLED is coupled to the second driving power source ELVSS. The organic light emitting diode OLED generates light with a luminance (e.g., a predetermined luminance) corresponding to the amount of current supplied from the pixel circuit 200'.

The pixel circuit 200' controls the amount of current flowing from the first driving power source ELVDD to the second driving power source ELVSS via the organic light emitting diode OLED, corresponding to a data signal. To this end, the pixel circuit 200' includes first to fifth transistors M1 to M5, an eighth transistor M8, and a storage capacitor Cst.

The eighth transistor M8 is coupled between a first node N1 and a reference power source Vref. In addition, a gate electrode of the eighth transistor M8 is coupled to an ith third scan line S3i. The eighth transistor M8 is turned on when a scan signal is supplied to the ith third scan line S3i to supply a voltage of the reference power source Vref to the first node N1. Here, the reference power source Vref is set to a voltage different from that of the first driving power source ELVDD.

The pixel PXL' shown in FIG. 24 supplies the voltage of the reference power source Vref to the first node N1, using the eighth transistor M8, when the organic light emitting display device is driven at the second driving frequency. That is, a driving process of the pixel PXL' shown in FIG. 24 is identical to that of the pixel of FIG. 2 except that the pixel PXL' supplies the voltage of the reference power source Vref, using the eighth transistor M8. Therefore, a detailed description of said elements may not be repeated. Additionally, the eighth transistor M8 may also be added to the pixels of FIGS. 8, 13, 14, 15, and 17.

Figure 25:
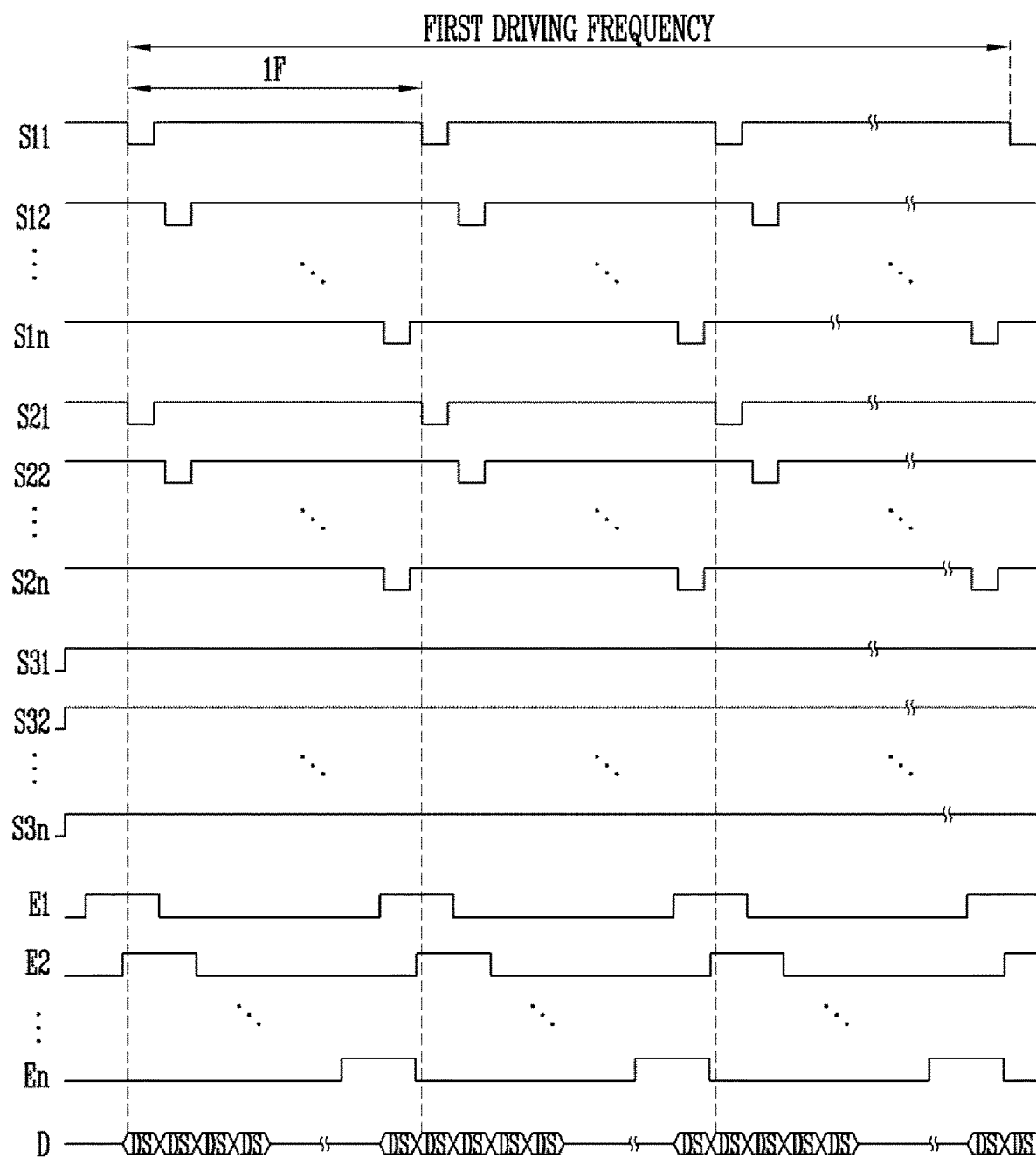
FIG. 25 is a waveform diagram illustrating an embodiment of a driving method when the pixel shown in FIG. 24 is driven at the first driving frequency.

FIG. 25 is a waveform diagram illustrating an embodiment of a driving method when the pixel shown in FIG. 24 is driven at the first driving frequency.

Referring to FIG. 25, when the organic light emitting display device is driven at the first driving frequency, scan signals are sequentially supplied to first scan lines S11 to S1n and second scan lines S21 to S2n during one frame period 1F. Here, a scan signal supplied to an ith first scan line S1*i* overlaps with that supplied to an ith second scan line S2*i*.

In addition, when the organic light emitting display device is driven at the first driving frequency, emission control signals are sequentially supplied to emission control lines E1 to En. Here, an emission control signal supplied to an ith emission control line Ei overlaps with scan signals supplied to an (i−1)th first scan line S1*i*−1 and the ith first scan line S1*i*. A data signal DS is supplied to the data lines Dm to be synchronized with the scan signals.

Then, a voltage corresponding to the data signal is stored in each of the pixels PXL', and accordingly, each of the pixels PXL' generates light with a luminance (e.g., a predetermined luminance) corresponding to the data signal DS. Additionally, third scan lines S31 to S3*n* receive a gate-off voltage from the third scan driver 170 during the period in which the organic light emitting display device is driven at the first driving frequency. That is, when the organic light emitting display device is driven at the first driving frequency, no scan signal is supplied to the third scan lines S31 to S3*n*.

Figure 26:
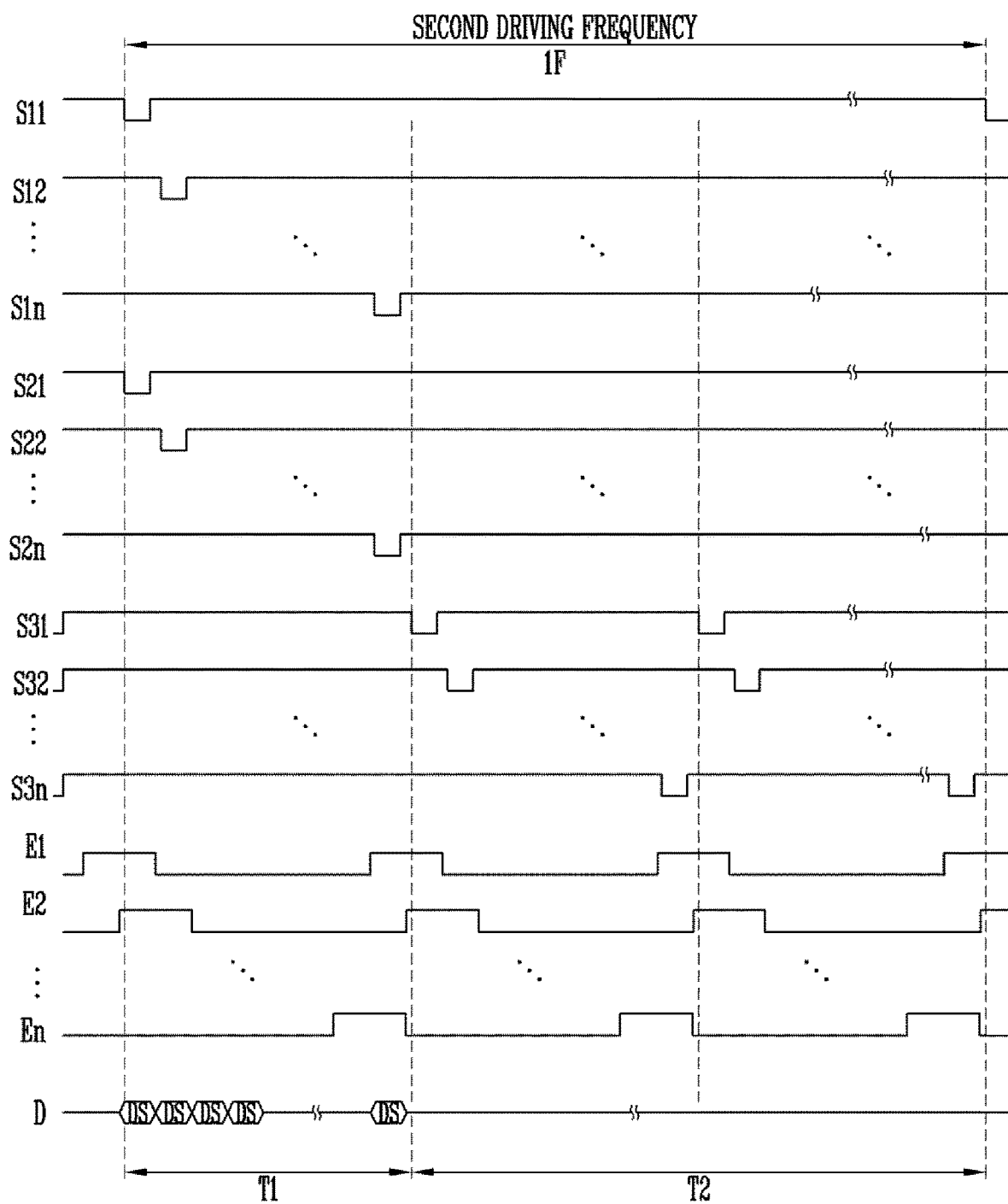
FIG. 26 is a waveform diagram illustrating an embodiment of a driving method when the pixel shown in FIG. 24 is driven at the second driving frequency.

FIG. 26 is a waveform diagram illustrating an embodiment of a driving method when the pixel shown in FIG. 24 is driven at the second driving frequency.

Referring to FIG. 26, when the organic light emitting display device is driving at the second driving frequency, one frame period 1F is divided into a first period T1 and a second period T2. Here, the second period T2 may be set as a period wider (e.g., having a longer duration) than the first period T1.

During the first period T1, scan signals are sequentially supplied to the first scan lines S11 to S1*n* and the second scan lines S21 to S2*n*. Here, a scan signal supplied to the ith first scan line S1*i* overlaps with that supplied to the ith second scan line S2*i*.

In addition, during the first period T1, emission control signals are sequentially supplied to the emission control lines E1 to En. Here, an emission control signal supplied to the ith emission control line Ei overlaps with scan signals supplied to the (i−1)th first scan line S1*i*−1 and the ith first scan line S1*i*. A data signal DS is supplied to the data lines D to be synchronized with the scan signals. Then, during the first period T1, a voltage corresponding to the data signal DS is stored in each of the pixels PXL'.

During the second period T2, a plurality of scan signals are supplied to each of the third scan lines S31 to S3*n*. Here, the scan signals supplied to each of the third scan lines S31 to S3*n* may be supplied for every set or predetermined period. In an embodiment, during the second period T2, scan signals may be supplied several times to the third scan lines S31 to S3*n* while being sequentially repeated.

During the second period T2, a plurality of emission control signals are supplied to each of the emission control lines E1 to En. Here, an emission control signal supplied to an ith emission control line Ei may be supplied to overlap with scan signals supplied to an (i−1)th third scan line S3*i*−1 and an ith third scan line S3*i*.

An operating process of the pixel PXL' will be described. During the first period T1, a voltage of the data signal DS is stored in each of the pixels PXL'. Then, the first transistor M1 supplies, to the organic light emitting diode OLED, a current (e.g., a predetermined current) corresponding to a difference between a voltage of the first driving power source ELVDD, applied to the first node, and a voltage of the data signal DS, applied to the second node N2.

During a partial period of the second period T2, an emission control signal is supplied to the ith emission control line Ei. When the emission control signal is supplied to the ith emission control line Ei, and the fifth transistor M5 is turned off. Then, the pixel PXL' is set to the non-emission state.

After that, a scan signal is supplied to the ith third scan line S3*i*. When the scan signal is supplied to the ith third scan line S3*i*, the eighth transistor M8 is turned on. When the eighth transistor M8 is turned on, a voltage of the reference power source Vref is supplied to the first node N1. Then, characteristics of the first transistor M1 are changed, and accordingly, the display quality of the organic light emitting display device can be improved. Here, the third scan driver 170 sequentially supplies scan signals to the third scan lines S31 to S3*n* at least two or more times.

As shown in FIGS. 25 and 26, when transistors coupled to the first scan lines S11 to S1*n* and the second scan lines S21 to S2*n* are set to the same conductivity type (e.g., a P-type), scan signals supplied from the first scan driver 110' and the second scan driver 120' are set identical to each other. In this case, the first scan driver 110' and the second scan driver 120' may be formed as one driver (e.g., one integrated driver circuit).

Additionally, when the transistors coupled to the first scan lines S11 to Sin and the second scan lines S21 to S2*n* are set to different conductivity types (e.g., a P-type and an N-type), the first scan driver 110' and the second scan driver 120' are set as different drivers. In an embodiment, when the third transistor M3 is set as an N-type transistor as shown in FIG. 9, the second scan driver 120' supplies a scan signal having a high voltage. In this case, the first scan driver 110' supplies a scan signal having a low voltage, and the second scan driver 120' supplies a scan signal having a high voltage. Accordingly, the first scan driver 110' and the second scan driver 120' are set as different drivers.

Figure 27:
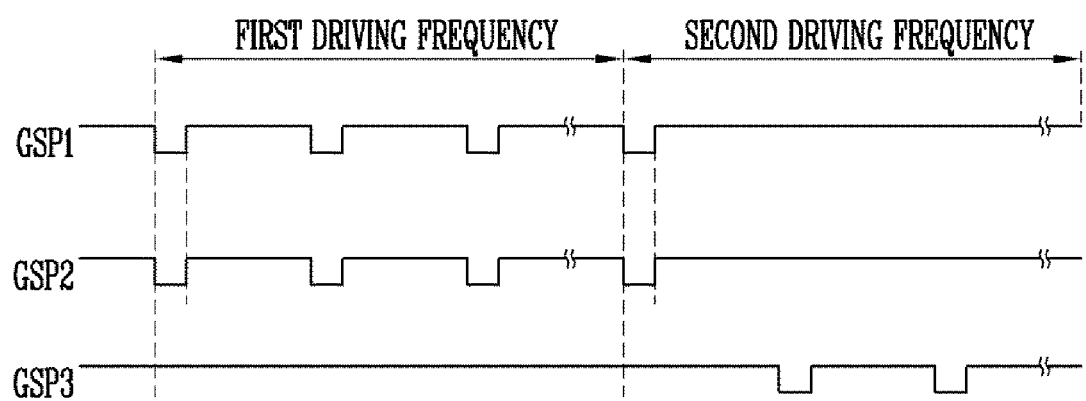
FIG. 27 is a waveform diagram illustrating gate start pulses supplied to a first scan driver, a second scan driver, and a third scan driver, shown in FIG. 23.

FIG. 27 is a waveform diagram illustrating gate start pulses supplied to the first scan driver, the second scan driver, and the third scan driver, shown in FIG. 23.

Referring to FIG. 27, when the organic light emitting display device is driven at the first driving frequency, first gate start pulses GSP1 are supplied to the first scan driver 110', and second gate start pulses GSP2 are supplied to the second scan driver 120'. Here, a number of first gate start pulses GSP1 supplied to the first scan driver 110' is set equal to that of second gate start pulses GSP2 supplied to the second scan driver 120'. In addition, when the organic light emitting display device is driven at the first driving frequency, no third gate start pulse GSP3 is supplied.

When the organic light emitting display device is driven at the second driving frequency, the first scan driver 110' and the second scan driver 120' supply scan signals during the first period T1, and the third scan driver 170 supplies scan signals during the second period T2. Here, because the second period T2 is set wider than the first period T1, p first gate start pulses GSP1 and p second gate start pulses GSP2 are supplied to the first scan driver 110' and the second scan driver 120', respectively, and I (I is greater than p) third gate start pulses GSP3 are supplied to the third scan driver 170.

In the organic light emitting display device and the driving method thereof according to the present disclosure, characteristics of the driving transistor are periodically initialized when the organic light emitting display device is driven at a low frequency, and accordingly, the display quality of the organic light emitting display device can be improved. In addition, each pixel is periodically set to the non-emission state when the organic light emitting display device is driven at the low frequency. Accordingly, the pixel can be driven under the same condition as when the organic light emitting display device is driven at a high frequency.

While in the above-described embodiments, various transistors are described as N-type transistors and others as P-type transistors, embodiments of the present invention are not limited thereto. For example, embodiments of the present disclosure also include ones in which the N-type transistors and P-type transistors of the described embodiments are switched, and the corresponding signal levels are inverted accordingly.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when an element is referred to as being "between" two elements, it can be the only element between the two elements, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the present disclosure as defined by the following claims and equivalents thereof.

What is claimed is:

1. A light emitting display device comprising:
   a first scan driver coupled to first scan lines;
   a second scan driver coupled to second scan lines an emission driver coupled to; and
   a pixel comprising:
      a first transistor comprising a first electrode coupled to a first node, a second electrode, and a gate electrode coupled to a second node;
      a second transistor comprising a first electrode coupled to a data line, a second electrode coupled to the first node, and a gate electrode coupled to one of the first scan lines;
      a capacitor comprising a first electrode coupled to a first driving power source and a second electrode coupled to the second node;
      a third transistor comprising a first electrode coupled to the second electrode of the first transistor, a second electrode coupled to the second node, and a gate electrode coupled to one of the second scan lines;
      a fourth transistor comprising a first electrode coupled to the second node, a second electrode coupled to an initialization power source, and a gate electrode coupled to another one of the second scan lines;
      a fifth transistor comprising a first electrode coupled to the first node, a second electrode coupled to the first driving power source, and a gate electrode;

a sixth transistor comprising a first electrode coupled to the second electrode of the first transistor, a second electrode, and a gate electrode; and a light emitting diode comprising an anode coupled to the second electrode of the sixth transistor and a cathode coupled to a second driving power source, wherein the third transistor and the fourth transistor are N-type transistors.

2. The light emitting display device of claim 1, further comprising:

an emission driver coupled to emission control lines;

wherein the gate electrode of the fifth transistor is coupled to one of the emission control lines.

3. The light emitting display device of claim 2, wherein the light emitting display device is configured to be driven at a first driving frequency or a second driving frequency that is lower than the first driving frequency.

4. The light emitting display device of claim 3, wherein the first scan driver is configured to supply first scan signals to the first scan lines during a first period and a second period of one frame period, when the light emitting display device is driven at the second driving frequency, and wherein the second scan driver is configured to supply second scan signals to the second scan lines during the first period and to not supply the second scan signals to the second scan lines during the second period, when the light emitting display device is driven at the second driving frequency.

5. The light emitting display device of claim 4, wherein the second period is longer than the first period.

6. The light emitting display device of claim 4, wherein the first scan driver is configured to supply the first scan signals to the first scan lines during one frame period, when the light emitting display device is driven at the first driving frequency, and wherein the second scan driver is configured to supply the second scan signals to the second scan lines during one frame period, when the light emitting display device is driven at the first driving frequency.

7. The light emitting display device of claim 6, wherein the one frame period of the first driving frequency is shorter than the one frame period of the second driving frequency.

8. The light emitting display device of claim 6, wherein the emission driver is configured to supply emission control signals to the emission control lines during the first period and the second period.

9. The light emitting display device of claim 8, further comprising a data driver configured to supply a data signal to the data line during the first period and to supply a voltage of a reference power source to the data line during the second period.

10. The light emitting display device of claim 1, wherein the first transistor and the second transistor are P-type transistors.

11. The light emitting display device of claim 1, wherein the fifth transistor is a P-type transistor.

12. The light emitting display device of claim 1, wherein the one of the second scan lines is ith second scan line (i is a natural number of 2 or more), and wherein the another one of the second scan lines is (i-1)th second scan line.

13. The light emitting display device of claim 1, wherein the first scan driver and the second scan driver are separated from each other.

14. The light emitting display device of claim 2, wherein the gate electrode of the sixth transistor is coupled to the one of the emission control lines.

15. The light emitting display device of claim 14, wherein the pixel further comprises:

a seventh transistor comprising a first electrode coupled to the second electrode of the sixth transistor, a second electrode coupled to the initialization power source, and a gate electrode coupled to the one of the emission control lines.

16. The light emitting display device of claim 15, wherein the seventh transistor is an N-type transistor.

* * * * *

UNITED STATES PATENT AND TRADEMARK OFFICE
CERTIFICATE OF CORRECTION

PATENT NO. : 11,935,471 B2
APPLICATION NO. : 17/688838
DATED : March 19, 2024
INVENTOR(S) : Yong Jae Kim et al.

Page 1 of 1

It is certified that error appears in the above-identified patent and that said Letters Patent is hereby corrected as shown below:

In the Claims

In Column 30, Lines 44-45, in Claim 1, after "lines" delete "an emission driver coupled to".

Signed and Sealed this
Second Day of July, 2024

Katherine Kelly Vidal
*Director of the United States Patent and Trademark Office*